United States Patent [19]

Usami et al.

[11] Patent Number: 4,999,520
[45] Date of Patent: Mar. 12, 1991

[54] HIGH SPEED TTL BUFFER CIRCUIT WHICH IS RESISTIVE TO THE INFLUENCE OF ALPHA-RAYS

[75] Inventors: Mitsuo Usami, Tokyo; Noboru Shiozawa, Ohme; Toshio Yamada; Hiromasa Katoh, both of Hamura; Kazuyoshi Satoh, Tokorozawa; Tohru Kobayashi, Iruma; Tatsuya Kimura, Ohme; Masato Hamamoto, Ohme; Atsushi Shimizu, Ohme; Kaoru Koyu, Ohme, all of Japan

[73] Assignee: Hitachi, Ltd., Tokyo, Japan

[21] Appl. No.: 330,461

[22] Filed: Mar. 30, 1989

[30] Foreign Application Priority Data

Apr. 2, 1988 [JP] Japan .................................. 63-81645
Apr. 12, 1988 [JP] Japan .................................. 63-89622
Oct. 28, 1988 [JP] Japan .................................. 63-274170

[51] Int. Cl.$^5$ ...................... H03K 3/33; H03K 17/04; H03K 19/013; H03K 19/088
[52] U.S. Cl. ................................... 307/456; 307/443; 307/300; 307/280
[58] Field of Search ................................ 307/454–456, 307/458, 466, 467, 443, 542, 551, 559, 561, 566, 300, 280, 475

[56] References Cited

U.S. PATENT DOCUMENTS

| 4,486,674 | 12/1984 | Neely | 307/456 X |
| 4,539,493 | 9/1985 | Varadarajan | 307/455 |
| 4,605,870 | 8/1986 | Dansky et al. | 307/456 X |
| 4,698,525 | 10/1987 | Tavana et al. | 307/456 |
| 4,860,065 | 8/1989 | Koyama | 307/456 X |

FOREIGN PATENT DOCUMENTS 124615  5/1988  Japan .

Primary Examiner—Stanley D. Miller
Assistant Examiner—David R. Bertelson
Attorney, Agent, or Firm—Antonelli, Terry, Stout & Kraus

[57] ABSTRACT

A semiconductor integrated circuit wherein an input circuit is formed by a phase split circuit consisting of a bipolar transistor which outputs an inverted output from the collector and non-inverted output from the emitter, the emitter follower output circuit is driven by an inverted output of the phase split circuit, meanwhile, an emitter load of the emitter follower output circuit is formed by a transistor, and the emitter load transistor is temporarily driven conductively by a charging current of the capacitance to be charged by the rising edge of the non-inverted output of the phase split circuit.

37 Claims, 18 Drawing Sheets

LOG1

LOG1

LOG1

LOG 1A

LOG 1B

LOG 1C

LOG 1D

LOG1

LOG1E

LOG1F

LOG 1

LOG 1

LOG1

LOG1

LOG3

LOG4

LOG5

LOG7

HIGH SPEED TTL BUFFER CIRCUIT WHICH IS RESISTIVE TO THE INFLUENCE OF ALPHA-RAYS

BACKGROUND OF THE INVENTION

The present invention relates to a logic circuit, particularly to the art effectively applied to a high speed logic circuit to be formed within a semiconductor integrated circuit, namely to the art effectively applied, for example, to NTL (Non Threshold Logic) or ECL (Emitter Coupled Logic) and moreover to the art effectively applied to the basic logic circuit within a bipolar gate array integrated circuit (for example, refer to Nikkei Electronics, No. 420, P117-120, May 4, 1987, Nikkei Mcgrow-Hill Inc.).

Some NTL and ECL circuits proposed receive low amplitude digital input signal and conduct high speed logic operations. Moreover, has been proposed NTL circuit with output emitter follower and ECL circuit with emitter follower formed by adding the output emitter follower circuit to NTL circuit and ECL circuit (hereinafter, the NTL circuit with output emitter follower is called NTL circuit and the ECL circuit with output emitter follower is called ECL circuit, respectively), high speed logic integrated circuit comprising the basic configuration of NTL circuit and the high speed logic circuit comprising the basic configuration of ECL circuit and NTL circuit.

FIG. 32 is a configuration example of the logic circuit of prior art.

The logic circuit $LOG_7$ shown in the same figure is formed as an NTL comprising a first transistor $Q_{36}$ forming a grounded emitter type phase inversion circuit and a second transistor $Q_{37}$ forming an emitter follower output circuit and a negative logic output $V_{o10}$ can be obtained for an input $V_{i7}$ as shown in FIG. 33 by applying an inversion output extracted from the collector of transistor $Q_{36}$ to the base of transistor $Q_{37}$.

In this case, this logic circuit $LOG_7$ is provided with a collector load resistance $R_{34}$, an emitter bias resistance $R_{35}$, a speedup capacitance $C_{a8}$ for improving switching operation of transistor $Q_{36}$ and an emitter load resistance $R_{36}$ of transistor $Q_{37}$.

The NTL circuit is described, for example, in the Japanese Patent Laid-open No. 63-124615.

SUMMARY OF THE INVENTION

The inventors of the present invention, however, have found that the NTL circuit technique described above is accompanied by following problems.

Namely, as the operation waveforms of logic circuit $LOG_7$ described are shown in FIG. 33, when the input $V_{i7}$ is changed to low level L from high level H and thereby the output $V_{o10}$ is changed to the high level H from the low level L, a load capacitance $CL_3$ is actively charged by the emitter follower operation of transistor $Q_{37}$ and thereby the output $V_{o10}$ can immediately be boosted up to the high level H from the low level L.

However, when the input $V_{i7}$ is changed to the high level H from the low level L and thereby the output $V_{o10}$ is changed to the low level L from the high level H, it is requested to wait for the charge of load capacitance $CL_3$ to be passively discharged by the emitter load resistance $R_{36}$. Therefore, comparatively longer delay time $t_{pd2}$ is generated at the change of output $V_{o9}$ to the low level L from the high level H.

In above logic circuit $LOG_7$, it is necessary for ensuring ensure short falling time of output $V_{o10}$ to sufficiently lower the resistance value of emitter load resistance $R_{36}$ of the transistor $Q_{37}$ to cause a discharge current $I_9$ from the load capacitance $CL_3$ to easily flow. However, when the value of emitter load resistance $R_{36}$ is lowered, a current steadily flowing into the emitter load resistance $R_{36}$ when the output $V_{o10}$ is high level H increases, also resulting in increase of current dissipation of the circuit.

As described above, the logic circuit described has a problem that it is difficult to simultaneously satisfy the low power consumption and high speed operation.

Moreover, a problem also rises that if the circuit elements are superminiaturized by the monolithic semiconductor integrated circuit technology since the logic circuit described, for example, is used as the basic logic circuit of a large capacity gate array integrated circuit, malfunction may easily be generated due to the influence of α-ray.

For the logic circuit formed by ECL, the improved circuit is indicated in the U.S. Pat. No. 4,539,493.

It is therefore an object of the present invention to provide a semiconductor integrated circuit which simultaneously satisfies high speed characteristic and low power consumption. Another object of the present invention is to provide a semiconductor integrated circuit which is resistive to the influence of the α-ray.

These and other objects and novel features of the present invention will be become apparent from the following description of the specification and the accompanying drawings of the present invention.

A typical disclosure of the present invention will be summarized hereinafter.

Namely, in the logic circuit forming NTL, the input circuit is formed by a phase split circuit, the emitter follower output circuit is driven with an inverted output of this phase split circuit, on the other hand, an emitter load of emitter follower output circuit is formed by a transistor and the emitter load transistor is temporarily conductively driven with a charging current of the capacitance which is charged by the rising edge of non-inverted output of such phase split circuit.

According to the means described above, in the transition period wherein the emitter follower output circuit transistor is changed to the non-conductive from the conductive condition at the transition of input logic, the emitter load transistor of the emitter follower output circuit temporarily becomes conductive quickly discharging the load capacitance, and in the steady state other than the transition period, the emitter load transistor keeps almost non-conductive state.

Thereby, the objects for simultaneously satisfying low power consumption and high speed characteristics, enabling the wired logic and receiving little influence of the α-ray can be attained.

Moreover, according to investigations by the inventors of the present invention, the current circuit speed of the NTL circuit is 70 ps/gate (under the loading condition) but it may be improved in future up to 30 ps/gate by applying the present invention to the logic circuit, namely the NTL circuit of FIG. 32. In addition, the power consumption of this NTL circuit may be lowered up to ½ to 1/5 in comparison with the ECL circuit of the prior art.

Furthermore, according to investigations by the inventors of the present invention, a logic circuit to which the present invention is applied is a low amplitude circuit and therefore realizes high speed operation. In addition, the power supply voltage of the logic circuit (logic part) to which the present invention is applied is a low voltage circuit (low voltage part) allowing a voltage as low as $-2.0$ — $-1.2$ V and therefore realizes low power supply voltage.

DESCRIPTION OF THE PREFERRED EMBODIMENTS

Figure 1:
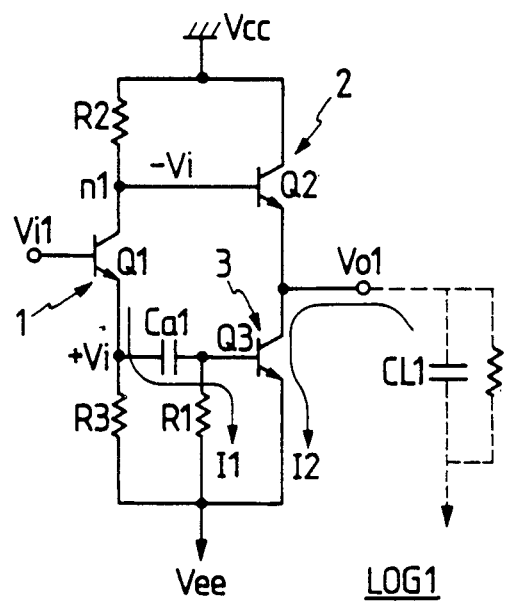
FIG. 1 illustrates the first principle of a first logic circuit to which the present invention is applied.
Figure 27:
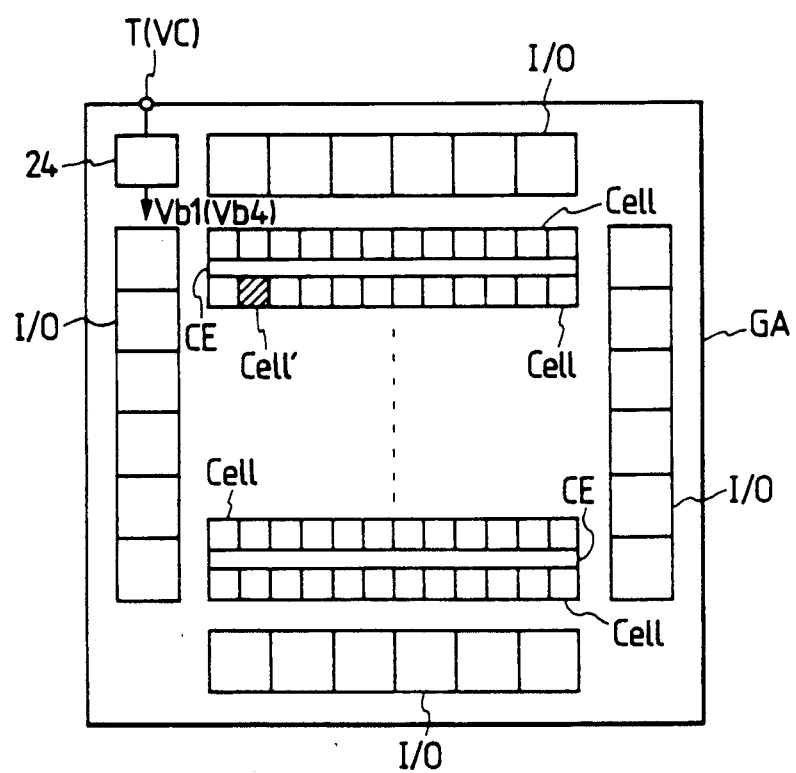
FIG. 27 is a schematic plan view indicating a large capacity gate array integrated circuit to which the present invention is applied.

FIG. 1 illustrates a first principle diagram of the first logic circuit to which the present invention is applied. In the following figures, the like elements are given the like numerals, a bipolar transistor shown is an NPN transistor and logic circuits shown in the figures forms, although not limited particularly, the one of cells as the basic logic circuit of the large capacity gate array integrated circuit as shown in FIG. 27 described rater and it is formed, together with the other cells, on the single P type semiconductor substrate such as a single crystal silicon. In FIG. 1, the logic circuit $LOG_1$ is formed by a phase split circuit 1, an emitter follower output circuit 2 which is driven by an inverted output $-V_i$ of this phase split circuit 1, an active pull-down circuit 3, and a differential capacitance $C_{a1}$ which differentiates the rising edge of the non-inverted output $+V_i$ of the phase split circuit 1.

In this case, the phase split circuit 1 described is formed by a bipolar transistor $Q_1$, a collector load resistance $R_2$ located in series between the collector of such bipolar transistor $Q_1$ and a high level power source voltage $V_{cc}$ and an emitter load resistance $R_3$ located in series between the emitter of bipolar transistor $Q_1$ and a low level power source voltage $V_{ee}$.

The emitter follower output circuit 2 is formed by an emitter follower transistor $Q_2$. The emitter of emitter follower transistor $Q_2$ is connected to the low level power source voltage $V_{ee}$ through the pull-down transistor $Q_3$ described later and simultaneously with a load capacitance $CL_1$ generated equitably by distributed capacitance of output lead wire and input capacitance of logic circuit in the next stage.

The active pull-down circuit 3 is formed by the pull-down transistor $Q_3$, which is an emitter load of the emitter follower output circuit 2 and such differential capacitance $C_{a1}$ is conductively driven temporarily by differentiating the rising edge of non-inverted output $+V_i$.

Above differential capacitance $C_{a1}$ is connected, at the one electrode, with the emitter of bipolar transistor $Q_1$ and, at the other electrode, with the base of pull-down transistor $Q_3$. The base of pull-down transistor $Q_3$ is connected in parallel with a resistance $R_1$. This resistance $R_1$ forms, together with the differential capacitance $C_{a1}$, a differential time constant and simultaneously discharge path for the remaining charge of the base of pull-down transistor $Q_3$.

To the base of bipolar transistor $Q_1$ forming the phase split circuit 1, the digital input signal $V_{i1}$ is supplied from the other logic circuits not illustrated in the large capacity gate array integrated circuit. Here, the power source voltage $V_{cc}$ of circuit is set to the ground potential, while the power source voltage $V_{ee}$ of circuit to predetermined negative power source voltage (for example, $-2$ V). Moreover, the digital input signal $V_{i1}$ is given comparatively small signal amplitude, for example, with the high level $V_H$ thereof set to $-0.8$ V or with the low level $V_L$ to $-1.4$ V.

Figure 2:
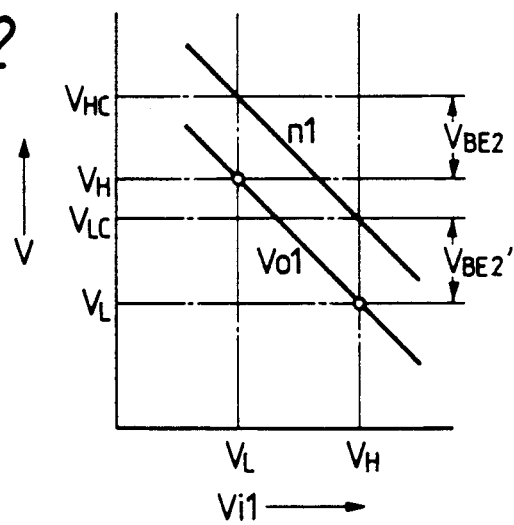
FIG. 2 is an input/output characteristic diagram of the first logic circuit of FIG. 1.

FIG. 2 is an input/output characteristic graph of the logic circuit $LOG_1$ shown in FIG. 1. In FIG. 2, the level of digital output signal $V_{o1}$ of the logic circuit $LOG_1$ shown in FIG. 1 will be explained.

When the digital input signal $V_{i1}$ is set to the predetermined low level $V_L$, the collector current $I_{c1}$ of bipolar transistor $Q_1$ becomes comparatively small value as indicated below when the base emitter voltage of bipolar transistor $Q_1$ and current conduction rate are respectively designated as $V_{BE1}$ and $\alpha_1$.

$$I_{c1} = (V_L - V_{BE1} - V_{ee}) \times \alpha_1/\alpha_3$$

In this case, a voltage of node $n_l$ is set to such a high level as $$V_{HC} = -R_2 \times I_{c1}$$

The high level $V_{Hc}$ of node $n_1$ is further shifted as much as base emitter voltage $V_{BE2}$ of transistor $Q_2$ forming the output emitter follower circuit. Thereafter, the digital output signal $V_{o1}$ of the logic circuit $LOG_1$ is set to the high level as indicated below.

$$V_H = V_{HC} - V_{BE2}$$

The high level $V_H$ of digital output signal $V_{O1}$ is set to the high level $V_H$ of digital input signal by setting the collector load resistance $R_2$ and emitter load resistance $R_3$.

Meanwhile, the digital input signal $V_{o1}$ is set to the predetermined high level $V_H$, the collector current $I_{C1}$, of bipolar transistor $Q_1$ becomes a comparatively large value as indicated below when the base emitter voltage of bipolar transistor $Q_1$ and current conduction rate are defined respectively as $V_{BE1'}$ and $\alpha_{1'}$.

$$I_{c1'} = (V_H - V_{BE1'} - V_{ee}) \times \alpha_{1'}/R_3$$

In this case, a voltage of node $n_1$ is set to a level as low as $$V_{LC} = -R_2 \times I_{c1'}$$

The low level $V_{LC}$ of node $n_1$ is set to the low level of digital output signal $V_{o1}$ of the logic circuit $LOG_1$ after it is shifted as much as the base emitter voltage $V_{BE2}$, of the emitter follower transistor $Q_2$. In this case, the low level $V_L$ of digital output signal $V_{01}$ is indicated as $$V_L = V_{LC} - V_{BE2'}$$

The low level $V_L$ of the digital output signal $V_{o1}$ can be set to the low level $V_L$ of digital input signal $V_{i1}$ by setting the collector load resistance $R_2$ and emitter load resistance $R_3$.

Figure 3:
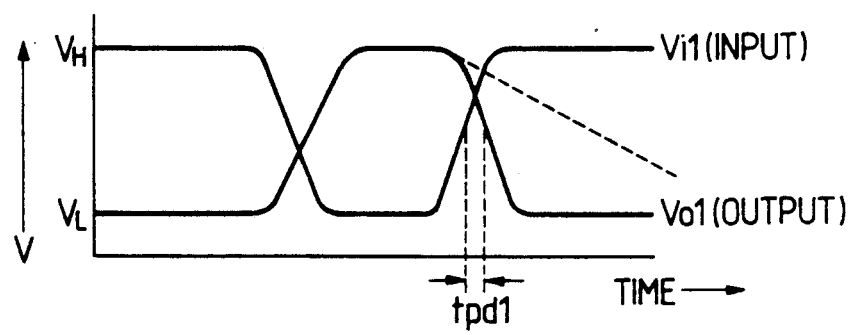
FIG. 3 illustrates waveforms operation examples of the first logic circuit of FIG. 1.

FIG. 3 illustrates waveforms indicating operation example of the logic circuit $LOG_1$ shown in FIG. 1.

In FIG. 3, potentials cf digital input signal $V_{i1}$ and digital output signal $V_{o1}$ are plotted on the vertical axis, while the time on the horizontal axis.

As indicated in the same figure, when the digital input signal $V_{i1}$ changes to the low level $V_L$ from the high level $V_H$, the load capacitance $CL_1$ is quickly charged by the emitter follower operation of the emitter follower transistor $Q_2$. Thereby, the digital output signal $V_{o1}$ is immediately rises up to the high level $V_H$ from the low level $V_L$ as in the case of the ECL circuit of the prior art.

When the digital input signal $V_{i1}$ changes to the high level $V_H$ from the low level $V_L$, a charging current $I_1$ of the differential capacitance $C_{a1}$ flows toward the base of pull-down transistor $Q_3$ from the emitter of bipolar transistor $Q_1$. Thereby, the pull-down transistor $Q_3$ is temporarily conductively driven, quickly discharging the load capacitance $CL_1$. Namely, the differential capacitance $C_{a1}$ differentiates the rising edge of non-inverted output $+V_i$ of the phase split circuit 1 and this differential output temporarily conductively drives the pull-down transistor $Q_3$. As a result, a large discharge current $I_2$ is extracted from the load capacitance $CL_1$ and the digital output signal $V_{o1}$ immediately drops to the low level $V_L$ from the high level $V_H$.

As described above, a delay time $t_{pd1}$ when the digital output signal $V_{o1}$ drops is sharply curtailed in the logic circuit $LOG_1$ described above and as shown in FIG. 3, the rising time becomes almost equal to the falling time of the digital output signal $V_{o1}$ and the differential output forces the pull-down transistor $Q_3$ to be driven temporarily and conductively. Therefore, the load driving capability becomes very high in case the load capacitance $CL_1$ is light and even in case it is heavy and the input impulse response can be improved because the load driving capability is high. Accordingly, since the rising time of digital output signal $V_{o1}$ is almost equal to the falling time, dependency on input waveform of digital input signal $V_i$ for the circuit speed of logic circuit $LOG_1$ can be reduced and the pull-down transistor $Q_3$ equivalently forming the emitter load of emitter follower output circuit 2 is transitionally and conductively driven only when the digital input signal $V_{i1}$ changes to the high level $V_H$ from the low level $V_L$ while the digital output signal $V_{o1}$ changes to the low level $V_L$ from the high level $V_H$, and in the steady state other than the transition period, the pull-down transistor $Q_3$ inhibits the emitter current according to keeping almost non-conductive state. Thereby, the logic circuit $LOG_1$ described above attains the high speed characteristic simultaneously with low power consumption.

In addition, in the logic circuit $LOG_1$ described, the emitter load in the normal condition is equivalently in the high impedance condition and thereby a current flowing from the output load side is suppressed to a low level while the low level $V_L$ output is obtained.

Thereby, it can be done easily to connect in common the outputs of a plurality of logic circuits to form a wired logic circuit.

Figure 4:
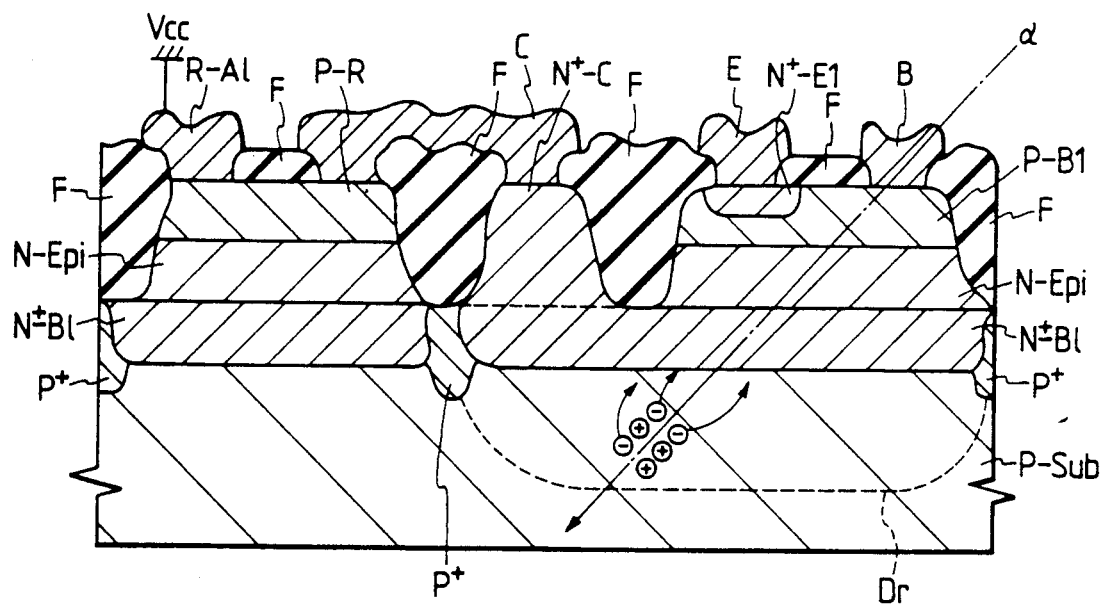
FIG. 4 is a sectional view of bipolar transistor and collector load resistance included in the first logic circuit shown in FIG. 1.

Moreover, in such logic circuit $LOG_1$, for example, even if the bipolar transistor $Q_1$ or $Q_3$ forming the phase split circuit 1 is effected by the $\alpha$-ray, such influence of $\alpha$-ray can be alleviated as explained for FIG. 4.

FIG. 4 is a sectional view of a bipolar transistor $Q_1$ and collector load resistance $R_2$ of logic circuit $LOG_1$ shown in FIG. 1.

In FIG. 4, P-Sub designates P type semiconductor substrate; N+-B1, N+type buried layer; N-$E_{pi}$, N type epitaxial layer; P-B1, base region of bipolar transistor $Q_1$; P-R, resistance layer of collector load resistance $R_2$; N+-E1, emitter region of bipolar transistor $Q_1$; N+-C, collector contact layer of bipolar transistor $Q_1$; p+, channel stop region; $D_r$, depletion layer region and F, field oxide film. B, E, C respectively designate aluminum electrodes of base, emitter and collector of the bipolar transistor $Q_1$. R-Al designates the electrode of collector load resistance $R_2$ formed by aluminum and is connected to the power source voltage $V_{cc}$. The collector load resistance $R_2$ may also be formed by the polysilicon layer.

Under the steady condition, when the $\alpha$-ray $\alpha$ is incident to the bipolar transistor $Q_1$, the halls $\oplus$ and electrons $\ominus$ are generated in the depletion layer region $D_r$. The electrons $\ominus$ are collected to the collector region of bipolar transistor $Q_1$ having the higher potential, thereby providing the effect as it were applying a leak current to the P type semiconductor substrate from the collector region of the bipolar transistor $Q_1$. In this case, a virtual collector current generated by the $\alpha$-ray lowers the collector current of bipolar transistor $Q_1$ but almost does not give any effect on the emitter voltage of bipolar transistor $Q_1$ since the base voltage is constant. Accordingly, the pull-down transistor $Q_3$ maintains the non-conductive condition without receiving the effect of $\alpha$-ray. While the pull-down transistor $Q_3$ sustains the non-conductive condition, the charges of load capacitance $CL_1$ is not discharged quickly even if only the collector voltage of bipolar transistor $Q_1$ is lowered temporarily by the $\alpha$-ray. Moreover, when the $\alpha$-ray is incident to the pull-down transistor $Q_3$, the collector voltage of pull-down transistor $Q_3$ is caused to become low as in the case of explanation about operation of pull-down transistor $Q_3$ for the $\alpha$-ray, but the collector of pull-down transistor $Q_3$ is clamped by operations of emitter follower transistor $Q_2$ and it does not drop largely. Therefore, the pull-down transistor $Q_3$ maintains the non-conductive condition and the charges of load capacitance $CL_1$ is not discharged quickly. In addition, it is impossible for the $\alpha$-ray entering the emitter follower transistor $Q_1$ (or pull-down transistor $Q_3$) to be incident to the pull-down transistor $Q_3$ (or bipolar transistor $Q_1$) from the characteristic of the $\alpha$-ray and it is almost far from possibility that a couple of $\alpha$-rays are respectively incident to the bipolar transistor $Q_1$ and pull-down transistor $Q_3$. Accordingly, the digital output signal $V_{o1}$ does not become low so much as drop of the collector voltage of bipolar transistor $Q_1$, for example, even when the $\alpha$-ray is incident to the bipolar transistor $Q_1$ or pull-down transistor $Q_3$. Namely, the influence of $\alpha$-ray can be eased.

Figure 5:
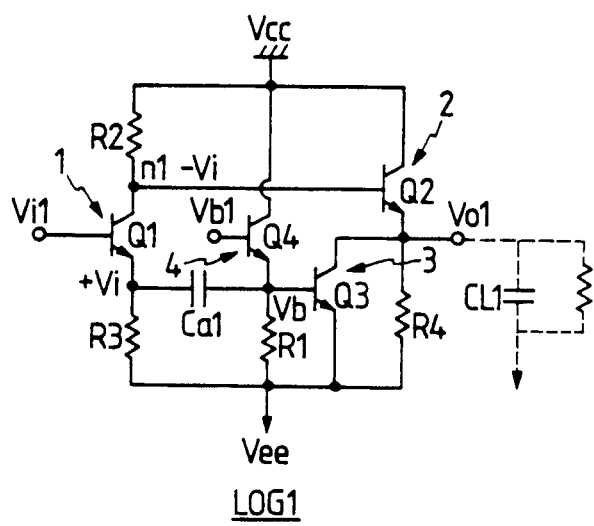
FIG. 5 is a first circuit diagram for realizing the first principle diagram of the first logic circuit shown in FIG. 1.
Figure 6:
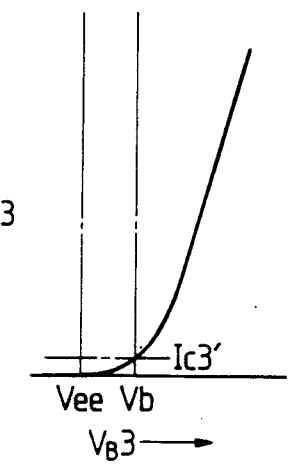
FIG. 6 is a characteristic graph indicating relationship between base voltage and collector current of a pull-down transistor included in the first logic circuit shown in FIG. 5.

FIG. 5 shows a first embodiment for realizing the logic circuit $LOG_1$ shown in FIG. 1 with the present invention. FIG. 6 illustrates the characteristic graph for explaining the relationship between the base voltage $V_{B3}$ and collector current $I_{c3}$ of the pull-down transistor $Q_3$ included to the logic circuit $LOG_1$ shown in FIG. 5.

Explanation will be made focusing on difference from FIG. 1. In the logic circuit $LOG_1$ of an embodiment shown in the same figure, although not limited particularly, the collector load resistance $R_2$, emitter load resistance $R_3$ and resistance $R_1$ are respectively set to 3 k$\Omega$, 2 k$\Omega$ and 40 k$\Omega$ and the differential capacitance $C_{a1}$ is set to 0.2 PF. Moreover, in this embodiment, a high resistance $R_4$ of 20 k$\Omega$ is provided for stabilizing the emitter voltage of the emitter follower transistor $Q_2$ in the steady state. Moreover, a bias circuit 4 which biases the pull-down transistor $Q_3$ in the steady state to the condition just before the conductive condition is also provided. This bias circuit 4 is formed by the bipolar transistor $Q_4$ to which the predetermined base control voltage $V_{b1}$ supplied from the external or internal circuit of the cell formed by the logic circuit $LOG_1$ is applied and the predetermined bias voltage $V_b$ is supplied to the base of pull-down transistor $Q_3$.

Here, the predetermined base control voltage $V_{b1}$ to be supplied to the base of bipolar transistor $Q_4$ is set to such a predetermined voltage as giving a voltage value for setting the pull-down transistor $Q_3$ to the very weak ON condition, namely the bias voltage $V_b$ which is generated the collector current $I_{c3}$ of the pull-down transistor $Q_3$ to $I_{c3}'$ (for example, 10-100 $\mu$A) as shown in FIG. 6.

Thereby, if the driving sensitivity of pull-down transistor $Q_3$ is enhanced and the capacitance value of the differential capacitance $C_{a1}$ is lowered to a small value, the pull-down transistor $Q_3$ is reliably driven conductively and the load capacitance $CL_1$ can be quickly discharged at the transition time where the digital input signal $V_{o1}$ is changed to the high level $V_H$ from the low level $V_L$.

As described, the falling time of the digital output signal $V_{o1}$ to the low level $V_L$ from the high level $v_H$ is further shortened and moreover the load capacitance $CL_1$ can be discharged more quickly even in case the load capacitance $CL_1$ is a heavy load. Moreover, a conductive driving level of the pull-down transistor $Q_3$ is determined by a capacitance value of differential capacitance $C_{a1}$ and the voltage value of bias voltage $V_b$. Namely, the load driving capability of the logic circuit $LOG_1$ can be controlled by changing the capacitance value of differential capacitance $C_{a1}$ or the voltage value of base control voltage $V_{b1}$ of bipolar transistor $Q_4$ and the falling rate of digital output signal $V_{o1}$ can also be controlled. The high impedance resistance $R_4$ for stabilizing emitter voltage of emitter follower transistor $Q_2$ in the steady state is not always required in case the base control voltage $V_{b1}$ of the bipolar transistor $Q_4$ is set to a constant value.

Figure 7A:
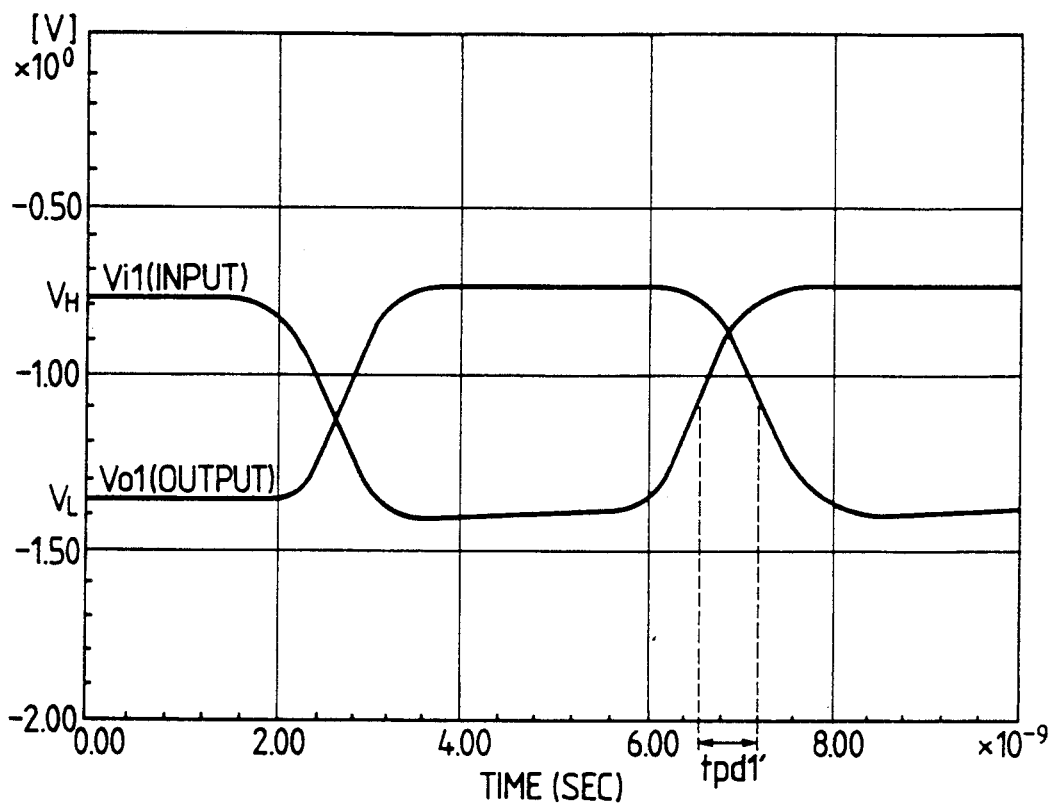
FIG. 7A illustrates waveforms indicating the simulation of the input and output signals of the first logic circuit shown in FIG. 5.
Figure 7B:
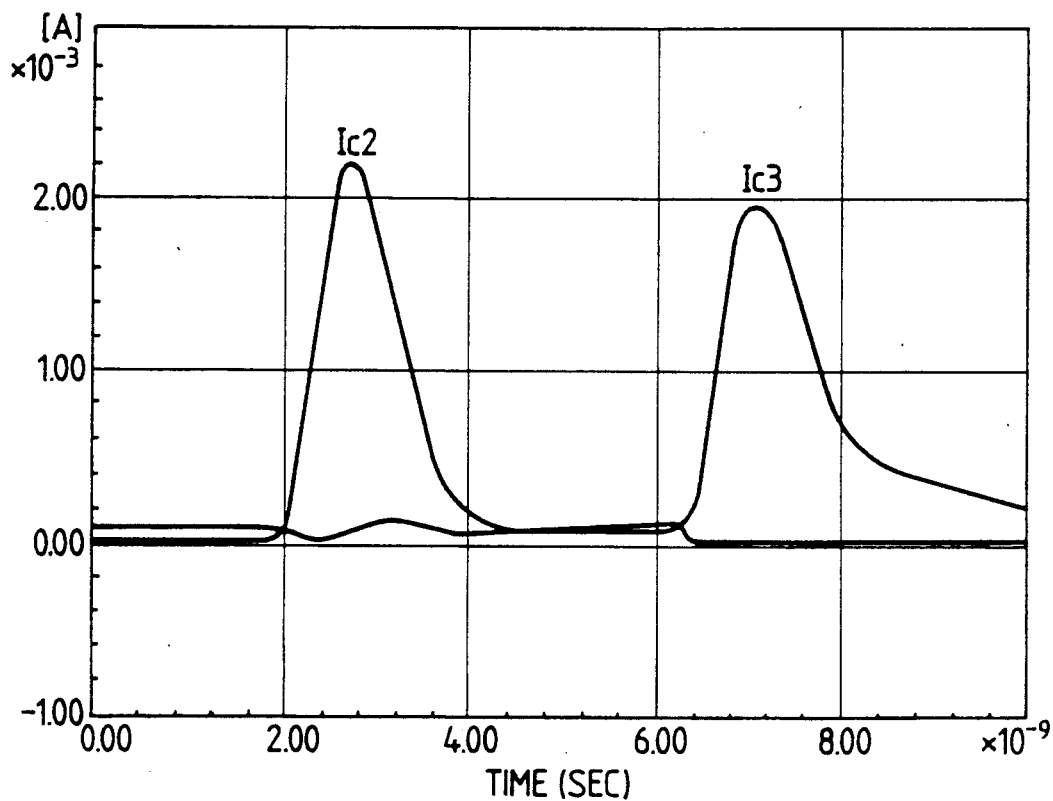
FIG. 7B illustrates waveforms indicating relationship between collector current of emitter follower transistor and collector current of pull-down transistor included in the first logic circuit shown in FIG. 5 during the simulation operation.

FIG. 7A illustrates waveforms indicating the simulation of input signal and output signal of the logic circuit $LOG_1$ shown in FIG. 5. FIG. 7B also illustrates waveforms indicating the collector current of emitter follower transistor $Q_2$ and the collector current of pull-down transistor $Q_3$ during the simulation.

In such simulation, the collector load resistance $R_2$ is set to 1.9 k$\Omega$, emitter load resistance $R_3$ to 1.3 k$\Omega$, resistance $R_1$ to 20 k$\Omega$, differential capacitance $C_{a1}$ to 0.7 1 pF, load capacitance $CL_1$ to 3 PF, base control voltage $V_{b1}$ to $-0.52$ V, power source voltage $V_{cc}$ to 0 V and power source voltage $V_{ee}$ to $-1.985$ V. The high resistance $R_4$ shown in FIG. 5 is not provided for this simulation.

In FIG. 7A, the time is plotted on the horizontal axis in the unit of second. On the other hand, the voltage of digital input signal $V_{i1}$ and digital output signal $V_{o1}$ is plotted on the vertical axis in the unit of volt. The digital input voltage $V_{i1}$ and digital output signal $V_{o1}$ respectively include some errors as shown in the waveforms of FIG. 7A and the high level or low level including such errors are also respectively indicated as the high level $V_H$ and low level $V_L$ in FIG. 7A. In FIG. 7B, the horizontal axis indicates the time like FIG. 7A in the unit of second and the current of vertical axis indicates the collector current $I_{c2}$ of emitter follower transistor $Q_2$ and collector current $I_{c3}$ of pull-down transistor $Q_3$ in the unit of ampere.

In FIG. 7A and FIG. 7B, when the digital input signal $V_{i1}$ changes to the high level $V_H$ from the low level $V_L$, the collector current $I_{c2}$ quickly increases due to the emitter follower operation of the emitter follower transistor $Q_2$ and thereby the load capacitance $CL_1$ is quickly charged, followed by that the digital output signal $V_{o1}$ rises up immediately to the high level $V_H$.

When the digital input signal $V_{i1}$ changes to the high level $V_H$ from the low level $V_L$, the pull-down transistor $Q_3$ is temporarilY driven conductively with an output of the differential capacitance $C_{a1}$ as described previously and thereby the collector current $I_{c3}$ of pull-down transistor $Q_3$ quickly increases and the load capacitance $CL_1$ is quickly discharged. Therefore, the digital output signal $V_{o1}$ falls to the low level $V_L$ from the high level $V_H$ with a delay time $t_{pdf}$ of about $0.6 \times 10^{-9}$ sec.

Figure 8:
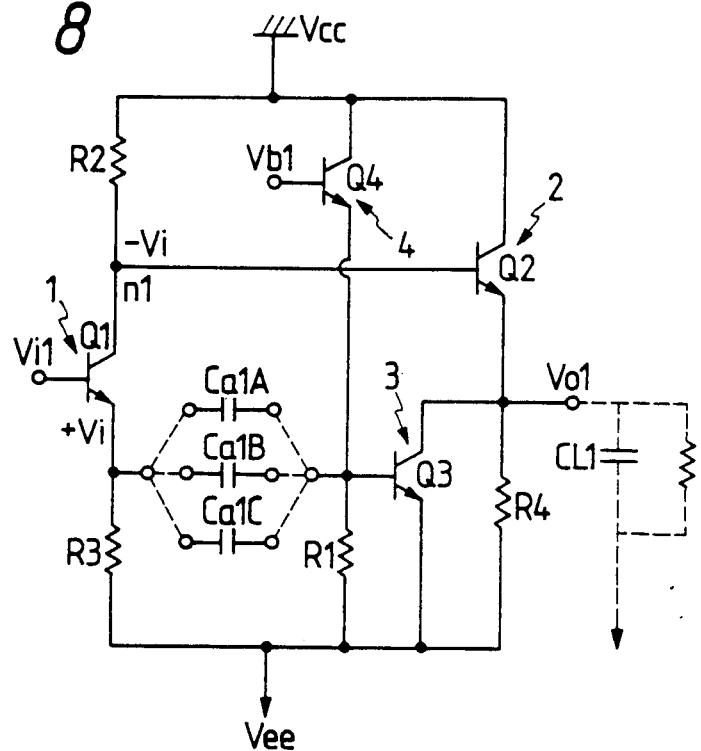
FIG. 8 is a circuit diagram providing a plurality of differential capacitances in the first logic circuit show in FIG. 5.
Figure 9:
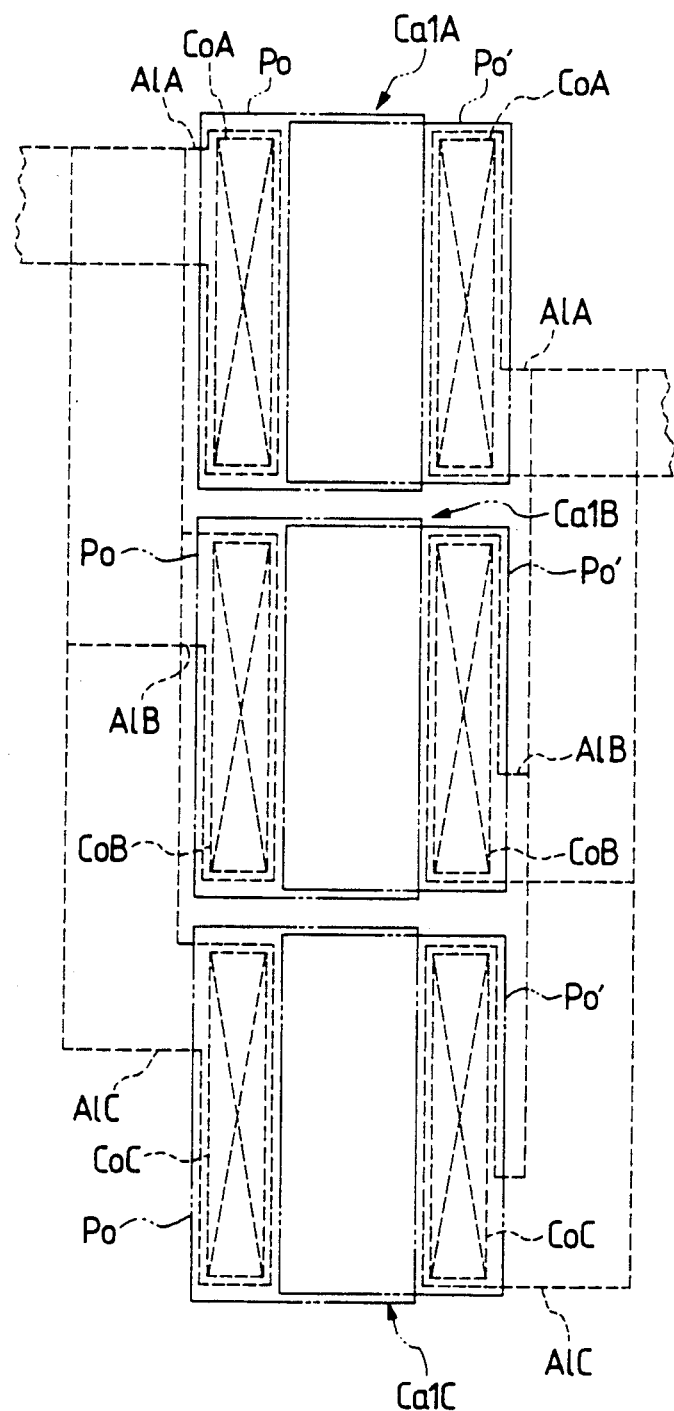
FIG. 9 is a layout diagram indicating a plurality of differential capacitances included in the first logic circuit shown in FIG. 8.

FIG. 8 indicates an embodiment providing a plurality of differential capacitances in the logic circuit $LOG_1$ shown in FIG. 5. FIG. 9 illustrates a layout of a plurality of differential capacitances shown in FIG. 8.

Explanation will be made hereunder focusing on difference from the embodiment of FIG. 5 with reference to FIG. 8. In the logic circuit $LOG_1$ shown in the same figure, the differential capacitances $C_{a1A}$, $C_{a1B}$ and $C_{a1C}$ are provided in place of the differential capacitance $C_{a1}$.

In FIG. 9, the regions Po and Po' enclosed by a broken line indicate the polysilicon layer, respectively. $A_{1A}$–$A_{1C}$ indicate wirings formed by the aluminum layer and $C_{oA}$–$C_{oC}$ indicate contact holes.

The differential capacitances $C_{1A}$, $C_{1B}$ and $C_{1C}$ are respectively formed in the doubled polysilicon layers formed from the polysilicon layers Po, Po', interposing dielectric films not illustrated. The wirings $A_{1A}$–$A_{1C}$ and contact holes $C_{oA}$–$C_{oG}$ coupled with the differential capacitances $C_{a1A}$, $C_{a1B}$ and $C_{a1C}$ are selected by CAD (Computer Aided Design) and DA (Design Automation). The differential capacitances $C_{a1A}$, $C_{a1B}$ or $C_{a1C}$ are coupled between the emitter of bipolar transistor $Q_1$ and the base of pull-down transistor $Q_3$ with the mask to form the pattern of selected wirings $A_{1A}$, $A_{1B}$ or $A_{1C}$ and contact holes $C_{oA}$, $C_{oB}$ or $C_{oG}$.

As described above, the logic circuit $LOG_1$ can select adequate load driving capability and falling rate of the digital output signal $V_{o1}$ for the load capacitance $CL_1$ by selecting the differential capacitances $C_{a1A}$, $C_{a1B}$ or $C_{a1C}$.

Figure 10:
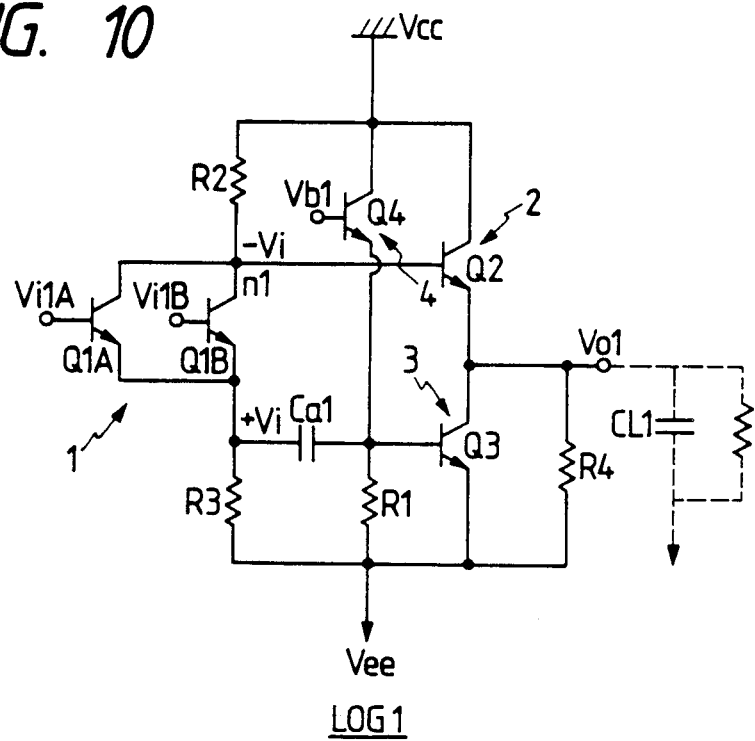
FIG. 10 is a circuit diagram indicating application example of the first logic circuit shown in FIG. 5.

FIG. 10 shows an embodiment indicating an application example of the logic circuit $LOG_1$ shown in FIG. 5 to which the present invention is applied.

Focusing to difference from FIG. 5, in the logic circuit $LOG_1$, the bipolar transistor $Q_1$ forming the phase split circuit 1 comprises the bipolar transistors $Q_{1A}$ and $Q_{1B}$ forming a 2-input logic circuit and the digital input signals $V_{i1A}$ and $V_{i1B}$ are respectively supplied to the bases of bipolar transistors $Q_{1A}$ and $Q_{1B}$.

Operations of embodiment shown in FIG. 10 will then be explained hereunder.

When the digital input signals $V_{i1A}$ and $V_{i1B}$ are all set to the low level $V_L$, the voltage of emitters connected in common of the bipolar transistors $Q_{1A}$ and $Q_{1B}$ becomes the low level and a comparatively small collector current flows into the collector load resistance $R_2$. Therefore, the node $n_1$ becomes high level $V_{HC}$ like the embodiment of FIG. 1, while the digital output signal $V_{o1}$ becomes predetermined high level $V_H$.

On the other hand, any one of the digital input signals $V_{i1A}$ and $V_{i1B}$ becomes high level $V_H$, the voltage of emitters connected in common of the transistors $Q_{1A}$ and $Q_{1B}$ becomes high level and a comparatively large collector current flows into the collector load resistance $R_2$. Thereby, the digital output signal $V_{o1}$ is set to the predetermined low level $V_L$.

Namely, the logic circuit $LOG_1$ of this embodiment functions as the 2-input NOR gate circuit in which the digital output signal $V_{o1}$ satisfies following logical expression.

$$V_{o1} = \overline{V_{i1A} \cdot V_{i1B}}$$
$$= \overline{V_{i1A} + V_{i1B}}$$

As described above, in the embodiment of FIG. 5, the bipolar transistor $Q_1$, of the logic circuit $LOG_1$, forming the phase split circuit 1 is provided in parallel and these are replaced by a couple of transistors $Q_{1A}$ and $Q_{1B}$ which respectively receive the digital input signals $V_{i1A}$ and $V_{i1B}$ corresponding to the bases of these transistors. When the digital input signals $V_{i1A}$ and $V_{i1B}$ are all low level $V_L$, the digital output signal $V_{o1}$ is set selectively to the high level $V_H$ and thereby the logic circuit $LOG_1$ of this embodiment functions as the 2-input NOR gate. It is natural that the logic circuit $LOG_1$ realizes low power consumption, like the embodiment of FIG. 1, without interference on the high operation rate. In addition, with increase or decrease in the number of bipolar transistors provided in parallel, the NOR gate circuit having a desired fan-in number can be realized.

Figure 11:
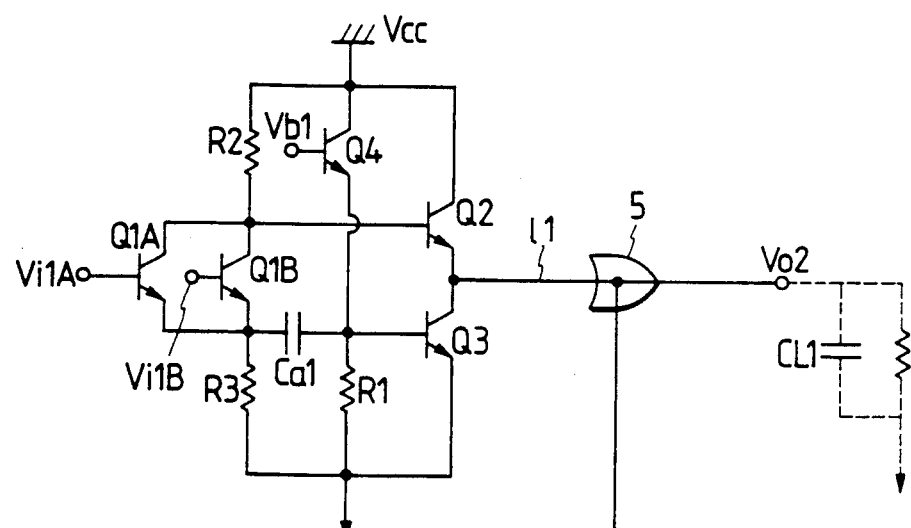
FIG. 11 is a circuit diagram indicating the first application example of the first logic circuit shown in FIG. 10.
Figure 11:
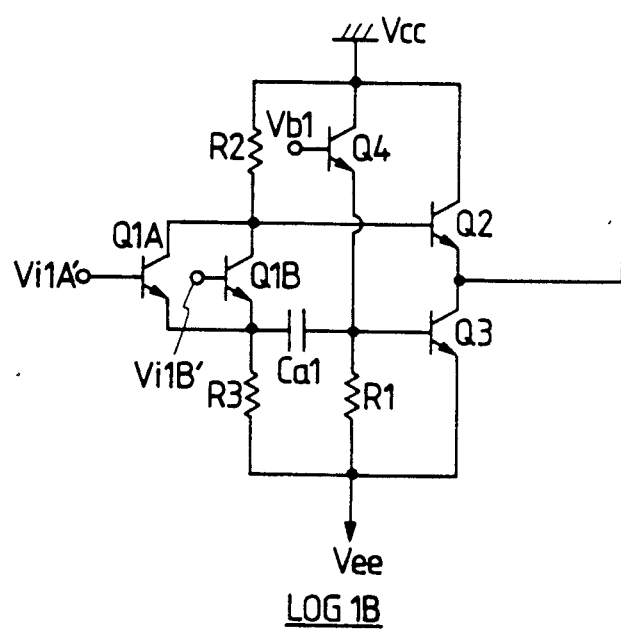

FIG. 11 illustrates a first application example comprising a wired logic 5 by connecting a couple of 2-input logic circuits $LOG_1$ shown in FIG. 10, as described, as the cell of large capacity gate array integrated circuit. In FIG. 11, the resistance $R_4$ shown in FIG. 10 may also be provided separately, although not illustrated. Moreover, since a pair of logic circuits $LOG_1$ are indicated, the one is designated as $LOG_{1A}$ and the other as $LOG_{1B}$. Moreover, the digital input signals $V_{i1A}$, $V_{i1B}$ are also indicated in the manner that the digital input signals of logic circuit $LOG_{1A}$ as $V_{i1A}$, $V_{i1B}$ and the digital input signals of logic $LOG_{1B}$ as $V_{i1A'}$, $V_{i1B'}$, corresponding to the logic circuits $LOG_{1A}$, $LOG_{1B}$.

As is already described, the emitter load is equivalently in the high impedance during the steady state and a current flowing from the load side during output of the low level $V_L$ is suppressed to a small level. Thereby, it can be realized easily to form a wired logic 5 by connecting in common the respective outputs without flowing of a steady current to the wires $l_1$ and $l_2$. Namely, the digital output signal $V_{o2}$ indicated below can be realized by forming the wired logics.

$$V_{o2} = (V_{i1A} + V_{i1B} + V_{i1A'} + V_{i1B'})$$

Moreover, if the wires $1_1$ and $1_2$ are formed by aluminum, for example, the electromigration is not easily generated because a steady current does not flow and thereby superminiaturization of wires $1_1$ and $1_2$ *l can be realized and in addition high speed operation and high integration density of large capacity gate array integrated circuit can also be realized.*

The electromigration is explained, for example, on page 393, of the book entitled "SEMICONDUCTOR DEVICE—BASIC THEORY AND PROCESS TECHNOLOGY", issued on May 25, 1987, SANGYO TOSHO Inc.

Figure 12:
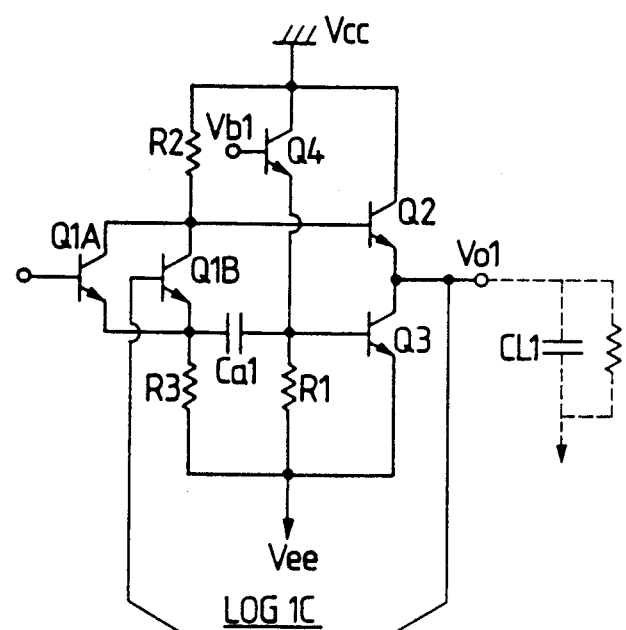
FIG. 12 is a circuit diagram indicating the second application example of the first logic circuit shown in FIG. 10.
Figure 12:
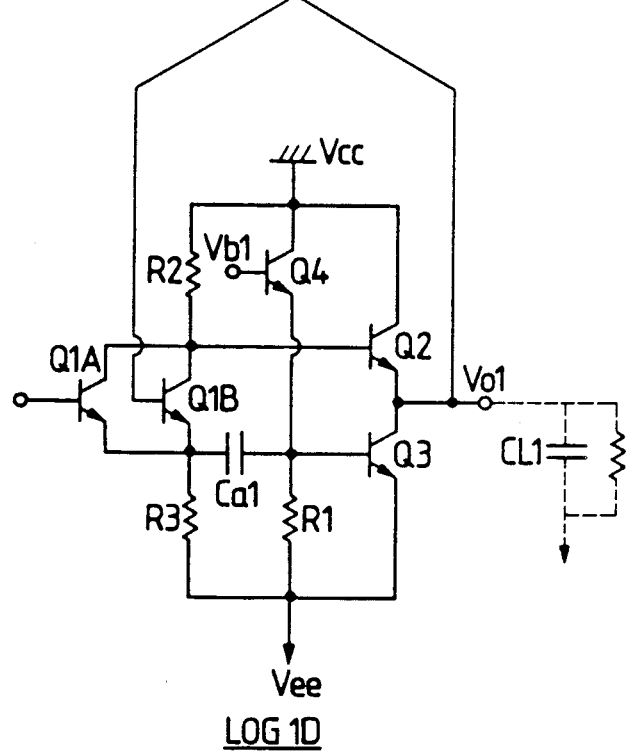

FIG. 12 is a second application example comprising a latch circuit using a pair or 2-input logic circuit $LOG_1$ shown in FIG. 10 as the cell of the large capacity gate array integrated circuit as described previously.

In FIG. 12, the resistance $R_4$ shown in FIG. 10 may also be provided separately, although not illustrated. Moreover, a pair of logic circuits $LOG_1$ are provided in FIG. 12 and the one is designated as $LOG_{1C}$, while the other as $LOG_{1D}$.

As is already described, both logic circuits $LOG_{1C}$, $LOG_{1D}$ assure the storing operations with very high reliability because the digital output signal $V_{o1}$ does not easily receive the influence of $\alpha$-ray.

Figure 13:
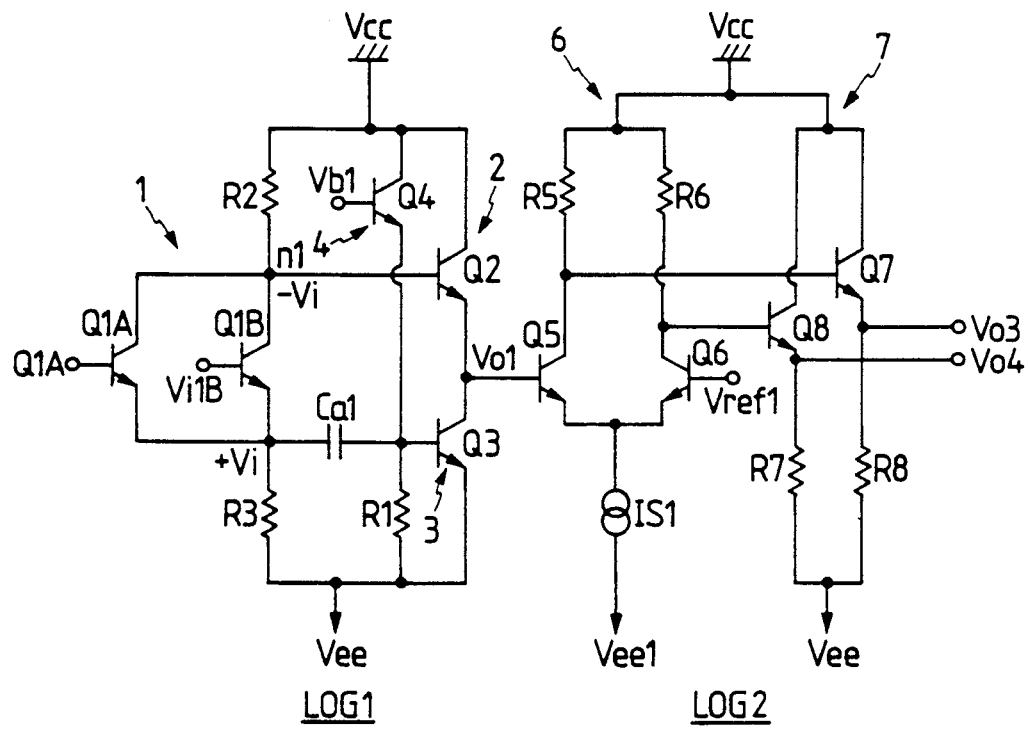
FIG. 13 is a circuit diagram coupling the first logic circuit shown in FIG. 10 to another logic circuit.

FIG. 13 indicates an embodiment in which the logic circuit $LOG_1$ shown in FIG. 10 and the logic circuit $LOG_2$ forming the ECL are respectively combined as the cells of large capacity gate array integrated circuit.

In FIG. 13, the logic circuit $LOG_2$ is formed by differential transistors $Q_5$ and $Q_6$ coupled between the power source voltage $V_{cc}$ and power source voltage $V_{ee1'}$ differential amplifier circuit 6 formed by resistances $R_5$, $R_6$ and constant current source $IS_1$ and emitter follower output circuit 7 formed by bipolar transistors $Q_7$ and $Q_8$ which are coupled between the power source voltage $V_{cc}$ and power source voltage $V_{ee}$ and receive output of the differential amplifier circuit 6 and resistances $R_7$ and $R_8$. Moreover, the digital output signal $V_{o1}$ of logic circuit $LOG_1$ is supplied to the base of bipolar transistor $Q_5$ and the reference voltage $V_{ref1}$ to the base of bipolar transistor $Q_6$. In the logic circuit $LOG_1$, the high resistance $R_4$ of FIG. 10, although not illustrated, may be provided by different manner. The power source voltage $V_{ee1}$ is set to the predetermined negative voltage and for example set to $-3$ V.

Operations of the logic circuits $LOG_1$, $LOG_2$ in the embodiment of FIG. 13 are explained hereunder.

The logic circuit $LOG_1$ is the same as the embodiment shown in FIG. 10 and therefore it is omitted here. When the digital output signal $V_{o1}$ of logic circuit $LOG_1$ is in the high level $V_H$, it conductively drives the bipolar transistor $Q_5$ because it is higher than the potential of reference voltage $V_{ref1}$ and the digital output signals $V_{o3}$, $V_{o4}$ of the emitter follower output circuit 7 respective become the low level $V_L$ and high level $V_H$. When the digital output signal $V_{o1}$ of logic circuit $LOG_1$ is low level $V_L$, it conductively drives the bipolar transistor $Q_6$ because it is lower than the reference voltage $V_{ref1}$ and the digital output signals $V_{o3}$, $V_{o4}$ of the emitter follower output circuit are respectively output as the high level $V_H$ and low level $V_L$.

The logic circuit $LOG_1$ and the logic circuit $LOG_2$ forming ECL can be arranged simultaneously on a semiconductor substrate of the large capacity gate array integrated circuit by adequately providing the resistances $R_1$-$R_8$ in order to assure compatibility of the logic amplitudes of the high level and low level of the digital output signal $V_{o1}$ of the logic circuit $LOG_1$ and the logic amplitude of the logic circuit $LOG_2$.

Figure 14:
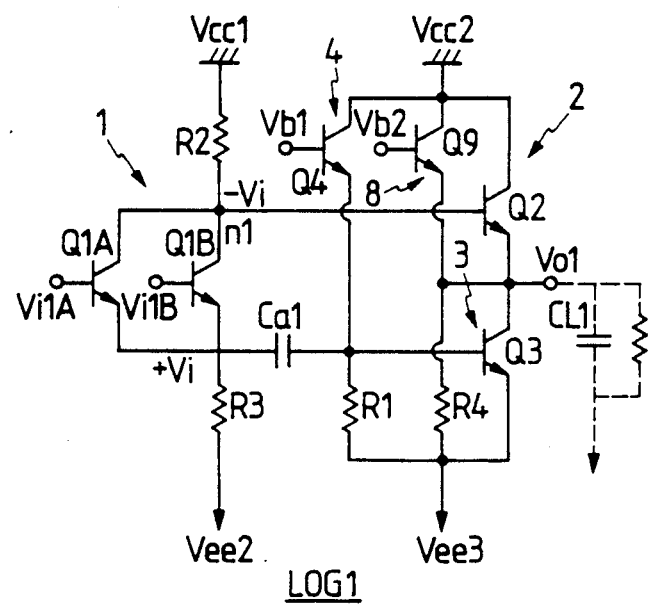
FIG. 14 is a circuit diagram stabilizing an output of the first logic circuit shown in FIG. 10.
Figure 15:
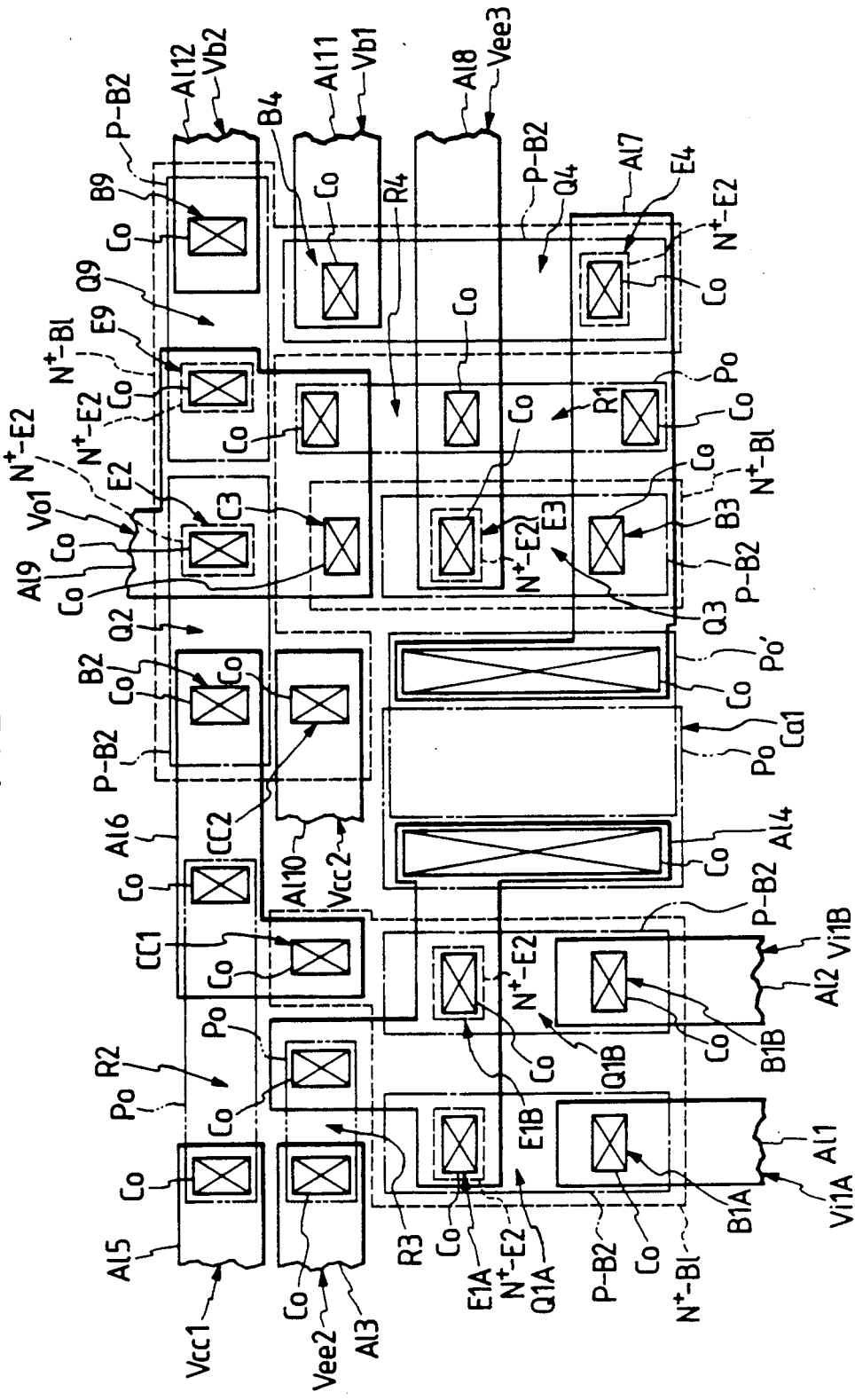
FIG. 15 is a layout of the first logic circuit shown in FIG. 14.

FIG. 14 indicates an embodiment for stabilizing outputs of logic circuit $LOG_1$ shown in FIG. 10. FIG. 15 is a layout of the logic circuit $LOG_1$ shown in FIG. 14.

In FIG. 14, explanation is made focusing on the difference from FIG. 10. The logic circuit $LOG_1$ comprises a bias circuit 4 for biasing the pull-down transistor $Q_3$ in the steady state to the condition just before the conductive condition and a clamp circuit 8 to prevent overshoot of the digital output signal $V_{o1}$ to the negative voltage side which may be generated when the pull-down transistor temporarily becomes conductive and the discharge current at this time is extracted excessively. Moreover, a pair of power supply lines are respectively provided for the power source voltages $V_{cc}$ and $V_{ee}$ in order to prevent malfunction by conductivity at the steady state of the pull-down transistor $Q_3$ due to variation of power source voltages $V_{ee}$ and $V_{cc}$ depending on temperature characteristic of the power supply lines of power source voltages $V_{ee}$ and $V_{cc}$, and the power source voltages supplied from respective power supply lines are indicated as $V_{cc1}$, $V_{cc2}$, $V_{ee2}$ and $V_{ee3}$.

The clamp circuit 8 is formed by the bipolar transistor $Q_9$ to which the predetermined base control voltage $V_b$ of low impedance is applied from the logic circuit not illustrated, and the voltage of digital output signal $V_{o1}$ is boosted above the low level $V_L$ with the emitter follower operation of transistor $Q_9$.

In FIG. 15, $N^+$-$B_1$ of the region enclosed by the dotted line designates $N^+$ type burred layer; $N^+$-$E_2$, the emitter region of corresponding bipolar transistors. The region P-$B_2$ enclosed by a broken line designates the base region of corresponding bipolar transistor; the regions Po, Po' enclosed by the broken line respectively designate the polysilicon layer, the region enclosed by a solid line designates the wirings $Al_1$-$Al_{12}$ formed by aluminum and each Co, the contact hole. $B_1$-$B_4$ and $B_9$, $E_1$-$E_4$ and $E_9$ designate the base and emitter of the bipolar transistors $Q_1$-$Q_4$ and $Q_9$; $C_3$ is collector of the emitter follower transistor $Q_3$; $CC_1$ and $CC_2$ designate the common collectors described later. The collector load resistance $R_2$ is not a resistance formed by the diffused layer shown in FIG. 4 but the resistance formed by the polysilicon layer.

In FIG. 15, the digital input signals $V_{i1A}$ and $V_{i1B}$ are supplied to the bases $B_{1A}$ and $B_{1B}$ of bipolar transistors $Q_{1A}$, $Q_{1B}$ through the corresponding wirings $Al_1$ and $Al_2$ formed by aluminum layer. The power source voltage $V_{ee2}$ is coupled to the emitters $E_{1A}$ and $E_{1B}$ of the bipolar transistors $Q_{1A}$, $Q_{1B}$ through the wirings $Al_3$ and $Al_4$ formed by aluminum layer and the load resistance $R_3$ formed by the polysilicon layer $P_o$. Moreover, these emitters $El_A$, $El_B$ are also coupled to the one electrode of differential capacitance $C_{a1}$ through the wiring $Al_4$ formed by the aluminum layer. The collectors of bipolar transistors $Q_{1A}$, $Q_{1B}$ are formed as the common collector $CC_1$ and is connected to the power source voltage $V_{cc1}$ through the wirings $Al_5$ and $Al_6$ and collector load resistance $R_2$ formed by the polysilicon layer $P_o$. This common collector $CC_1$ is coupled to the base $B_2$ of emitter follower transistor $Q_2$ through the wiring $Al_6$ formed by the aluminum layer.

The differential capacitance $C_{a1}$ is formed by interposing a dielectric film not illustrated between the doubled polysilicon layers formed by the polysilicon layers $P_o$, $P_o'$ and the one electrode of the differential capacitance $C_{a1}$ is coupled to the emitters $E_{1A}$ and $E_{1B}$ of the bipolar transistors $Q_{1A}$, $Q_{1B}$ and emitter load resistance $R_3$ through the wiring $Al_4$ formed by the aluminum layer. The other electrode of differential capacitance $C_{a1}$ is coupled to the base $B_3$ of pull-down transistor $Q_3$, resistance $RI$ formed by polysilicon layer $P_o$ and emitter $E_4$ of bipolar transistor $Q_4$ through the wiring $Al_7$ formed by the aluminum layer.

The pull-down transistor $Q_3$ is connected, at its base $B_3$, to the differential capacitance $C_{a1}$, resistance $R_1$ and emitter $E_4$ of bipolar transistor $Q_4$ through the wiring $Al_7$ formed by the aluminum layer, as described above. The emitter $E_3$ of pull-down transistor $Q_3$ is connected to the power source voltage $V_{ee3}$ and the resistance $R_1$ formed by the polysilicon layer $P_o$ through the wiring $Al_8$ formed by the aluminum layer. The collector $C_3$ of pull-down transistor $Q_3$ is connected to the emitter $E_2$ of emitter follower transistor $Q_2$, emitter $E_9$ of bipolar transistor $Q_9$ and the resistance $R_4$ formed by the polysilicon layer $P_o$ through the wiring $Al_9$ formed by the aluminum layer and this wiring $Al_9$ of aluminum layer is used for outputting the digital output signal $V_{o1}$.

The emitter $E_2$ of emitter follower transistor $Q_2$ is connected, as described above, to the collector $C_3$ of pull-down transistor $Q_3$, resistance $R_4$, and emitter $E_9$ of bipolar transistor $Q_9$. The base $B_2$ of emitter follower transistor $Q_2$ is connected, as described, to the common collector $CC_1$ and collector load resistance $R_2$ of the bipolar transistors $Q_{1A}$, $Q_{1B}$ through the wiring $Al_6$ formed by the aluminum. The collector of emitter follower transistor $Q_2$ is coupled in common with the collectors $CC_2$ of bipolar transistors $Q_4$, $Q_9$ and this common collector is connected to the power source voltage $V_{cc2}$ through the wiring $Al_{10}$ formed by the aluminum layer.

Regarding the emitter $E_4$ and collector of the bipolar transistor $Q_4$, the emitter $E_4$ is coupled to the base $B_3$ of pull-down transistor $Q_3$, differential capacitance $C_{a1}$ and resistance $R_1$ through the wiring $Al_7$ formed by the aluminum layer, while the collector is formed as the common collector $CC_2$ together with the collectors of emitter follower transistor $Q_2$ and bipolar transistor $Q_4$. The base $B_4$ of bipolar transistor $Q_4$ is connected to the wiring $Al_{11}$ formed by the aluminum layer and the base control voltage $Vb_1$ is supplied through this wiring.

The emitter $E_9$ and collector of the bipolar transistor $Q_9$ are connected, as described above, to the resistance $R_4$, emitter $E_2$ of emitter follower transistor $Q_2$ and collector $C_3$ of pull-down transistor $Q_3$ through the wiring $Al_9$ formed by the aluminum layer, while the collector is formed as the common collector $CC_2$ together with the collector of bipolar transistor $Q_9$ and collector of emitter follower transistor $Q_4$. The base $B_9$ of bipolar transistor $Q_9$ is coupled to the wiring $Al_{12}$ formed by the aluminum layer and the base control voltage $V_{b2}$ is supplied through this wiring.

As described above, the overshoot of digital output signal $V_{o1}$ toward the negative voltage is prevented and low level $V_L$ of digital output signal $V_{o1}$ can be ensured. Moreover, since the collectors of bipolar transistors $Q_{1A}$ and $Q_{1B}$ forming the phase split circuit 1 or the collectors of bipolar transistor $Q_4$ of bias circuit 4 and the bipolar transistor $Q_9$ of clamp circuit 8 are formed on the same region of a semiconductor substrate, thereby realizing a superminiaturized cell.

Figure 16:
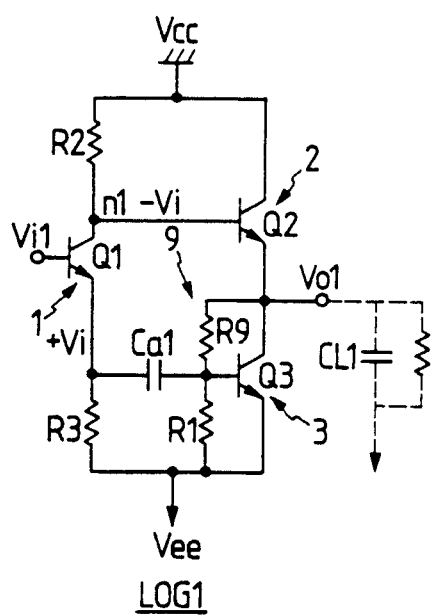
FIG. 16 is a second circuit diagram for realizing the first principle diagram of the first logic circuit shown in FIG. 1.

FIG. 16 indicates a second embodiment for realizing the first principle diagram of the logic circuit $LOG_1$ shown in FIG. 1 to which the present invention is applied.

FIG. 16 will be explained focusing on difference from the embodiment of FIG. 1. The logic circuit $LOG_1$ of this embodiment also is provided with a bias circuit 9.

The bias circuit 9 is formed by the resistance $R_9$ coupled between the emitter of emitter follower transistor $Q_2$ and the differential capacitance $C_{a1}$. This bias circuit 9 increases a charging current for driving the pull-down transistor $Q_3$ with the differential capacitance $C_{a1}$ by DC-feedback of the digital output signal $V_{o1}$ to the base of pull-down transistor $Q_3$ through the resistance $R_9$ when the digital output signal is in the high level $V_H$.

Thereby, good falling characteristic can be obtained even when the load capacitance $CL_1$ changes.

Figure 17:
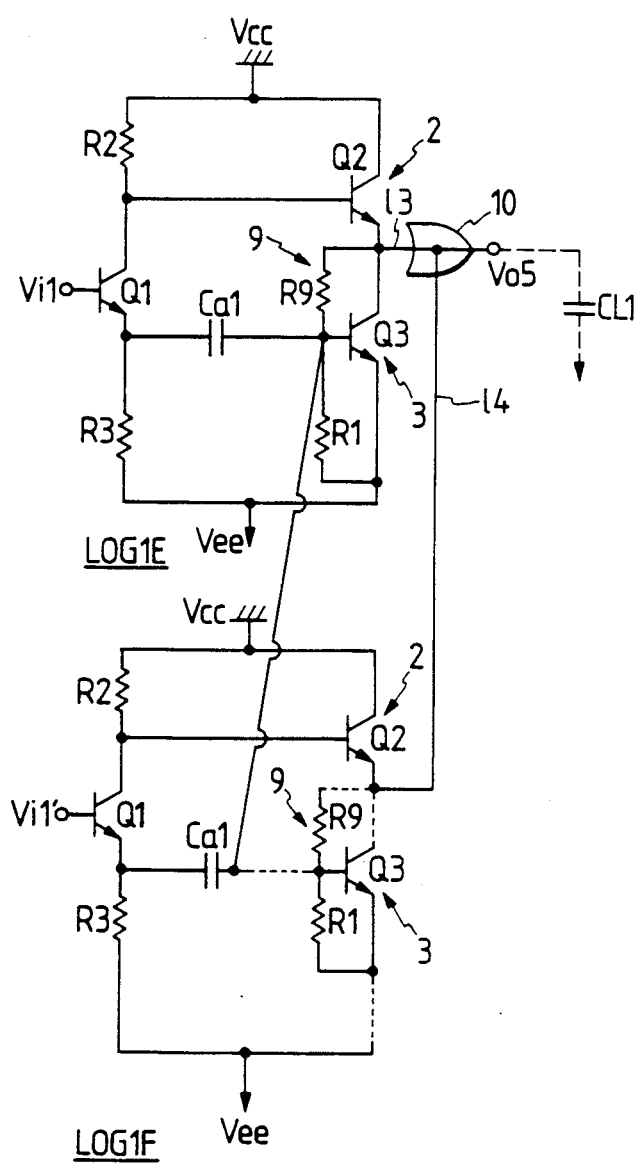
FIG. 17 is a circuit diagram indicating an application example of the first logic circuit shown in FIG. 16.

FIG. 17 indicates an embodiment of the wired logic 10 formed by wiring a couple of logic circuits $LOG_1$ shown in FIG. 16 as the cells of large capacity gate array integrated circuit.

In FIG. 17, since a pair of logic circuits $LOG_1$ are shown, the one is designated as $LOG_{1E}$ and the other as $LOG_{1F}$. Moreover, the digital input signal $V_{i1}$ is also indicated as $V_{i1}$ and $V_{i1'}$, respectively for the logic circuits $LOG_{1E}$ and $LOG_{1F}$. As is already described, a pair of logic circuits $LOG_{1E}$, $LOG_{1F}$ can easily form the wired logic 10 since a current flowing from the load side when the output is low level $V_L$ is suppressed to a lower level.

In FIG. 17, the digital output signal $V_{o5} = (V_{i1} + V_{i1'})$ for the digital input signals $V_{i1}$, $V_{i1'}$, can be realized by forming the wired logic 10. In the same figure, the wired logic 10 is formed by non-connection of a part of the cell formed by the logic circuit $LOG_{1F}$ namely non-application of the bias circuit 9, resistance $R_1$ and pull-down transistor $Q_3$ of the logic circuit $LOG_{1D}$. Accordingly, a current flowing from the load side is suppressed smaller than that in the embodiment of FIG. 11 and moreover electromigration of wirings $l_3$ and $l_4$ is not easily generated and superminiaturization can then be realized.

Figure 18:
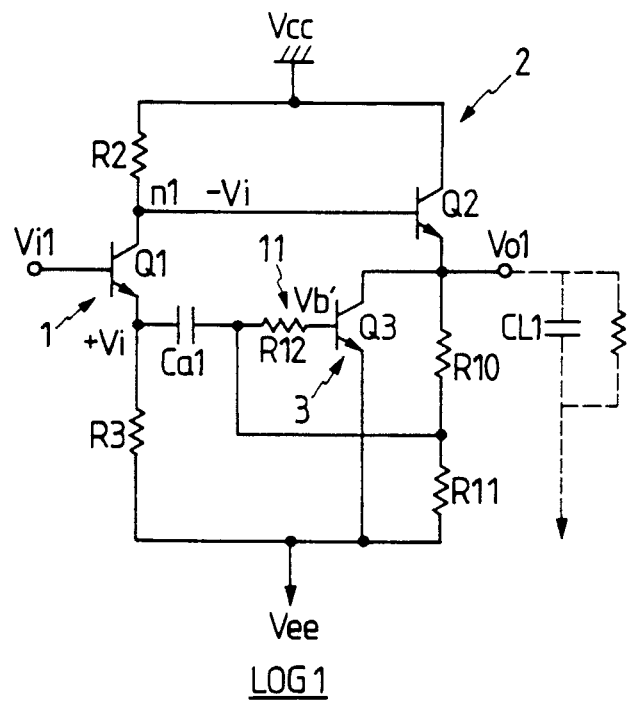
FIG. 18 is a third circuit diagram for realizing the first principle diagram of the first logic circuit shown in FIG. 1.

FIG. 18 indicates a third embodiment for realizing the first principle diagram of the logic circuit $LOG_1$ shown in FIG. 1 by the present invention.

Explanation will be made focusing on difference from FIG. 1. The logic circuit $LOG_1$ is formed as a load means of the emitter follower transistor $Q_2$ forming the output emitter follower circuit and moreover with addition of serial resistances $R_{10}$ and $R_{11}$. A resistance $R_{12}$ is provided, although not particularly limited, between the node connected in common of the resistances $R_{10}$ and $R_{11}$ and the base of pull-down transistor $Q_3$. The base of pull-down transistor $Q_3$ is coupled with capacitance to the emitter of the bipolar transistor $Q_1$ through the differential capacitance $C_{a1}$. Here, the resistances $R_{10}$ and $R_{11}$ are designed to have comparatively large resistance values and the resistance $R_{12}$ is designed to have a predetermined resistance value which makes sufficiently large an input impedance of the pull-down transistor $Q_3$. Thereby, the resistance $R_{12}$ forms a bias circuit 11, together with the resistances $R_{10}$ and $R_{11}$, which gives the predetermined bias voltage $V_b$, to the base of pull-down transistor $Q_3$ and also forms a differential circuit, together with the differential capacitance $C_{a1}$, which transmits level change of digital input signal $V_{i1}$ to the base of pull-down transistor $Q_3$.

When the digital input signal $V_{i1}$ is fixed to the predetermined low level $V_L$ and the digital output signal $V_{o1}$ to the predetermined high level $V_H$, the bias voltage $V_b$, predetermined by the resistance ratio of resistances $R_{10}$ and $R_{11}$ is applied to the base of pull-down transistor $Q_3$. This bias voltage $V_b$, is set to the predetermined voltage value which makes the pull-down transistor $Q_3$ to weak ON condition as in the case of the embodiment shown in FIG. 5. Thereby, the pull-down transistor $Q_3$ is set to the very weak ON condition without giving influence on the digital output signal $V_{o1}$.

When the digital input signal $V_{i1}$ changes to the high level $V_H$ from the low level $V_L$, the base voltage of pull-down transistor $Q_3$ becomes temporarily high since level change of digital input signal $V_{i1}$ is transmitted through the differential circuit formed by the differential capacitance $C_{a1}$ and resistance $R_{12}$. Therefore, the pull-down transistor $Q_3$ becomes perfect ON condition temporarily and the digital output signal $V_{o1}$ is quickly changed to the low level $V_L$ from the high level $V_H$.

While the digital input signal $V_{i1}$ is fixed to the predetermined high level $V_H$ and the digital output signal $V_{o1}$ to the predetermined low level $V_L$, the base voltage of pull-down transistor $Q_3$ is set to the low level and the pull-down transistor $Q_3$ is set to almost the cut-off condition. Under this condition, when the digital input signal $V_{i1}$ changes to the low level $V_L$ from the high level $V_H$, the base voltage of pull-down transistor $Q_3$ is temporarily lowered because level change of digital input signal $V_{i1}$ is transmitted through the differential circuit. Thereby, the transistor $Q_3$ is further set to deep cut-off condition and the digital output signal $V_{o1}$ is quickly changed to the high level from the low level $V_L$ through the emitter follower transistor $Q_2$.

As described above, the base of pull-down transistor $Q_3$ in the logic circuit $LOG_1$ of this embodiment is capacitively coupled to the emitter of bipolar transistor $Q_1$ through the differential capacitance $C_{a1}$ and also coupled to the node connected in common of the resistances $R_{10}$ and $R_{11}$ through the resistance $R_{12}$. The resistance $R_{12}$. The resistance $R_{12}$ forms the differential circuit, together with the differential capacitance $C_{a1}$, which sends level change of digital input signal $V_{i1}$ to the base of pull-down transistor $Q_3$ and also forms a bias circuit 11, together with the resistances $R_{10}$ and $R_{11}$, which gives the predetermined bias voltage $V_b$, to the base of pull-down transistor $Q_3$. The logic circuit $LOG_1$ of this embodiment enhances the driving sensitivity of the pull-down transistor $Q_3$ by supplying the bias voltage $V_b$, to the base of pull-down transistor $Q_3$. The malfunction due to the change of power source voltage $V_{ee}$ of pull-down transistor $Q_3$ shown in FIG. 14 can be reduced by supplying the bias voltage $V_b$, with the digital output signal $V_{o1}$.

Figure 19:
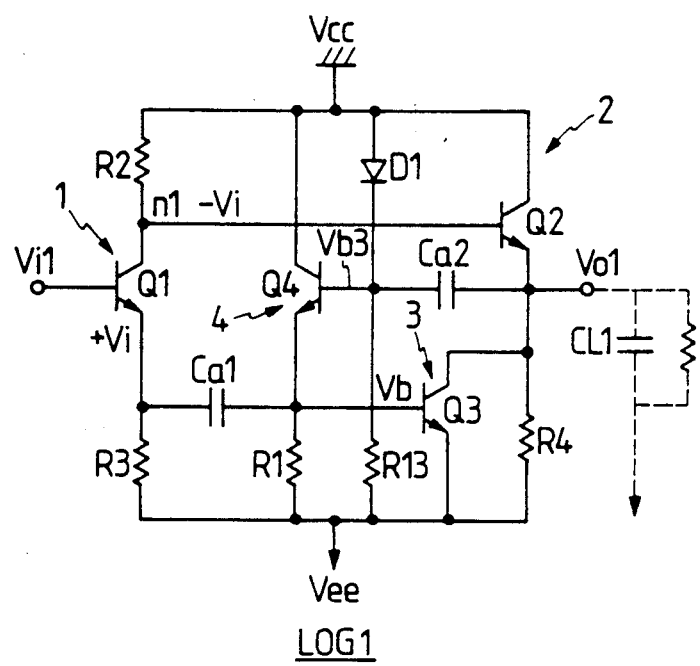
FIG. 19 is a circuit diagram providing a constant voltage generating circuit in the first logic circuit shown in FIG. 5.

FIG. 19 indicates an embodiment in which a constant voltage circuit is added to the logic circuit $LOG_1$ shown in FIG. 5.

Emphasis is placed on difference from FIG. 5 for the following explanation. In the same figure, a diode $D_1$ is provided between the base of bipolar transistor $Q_4$ and power source voltage $V_{cc}$. Moreover, a resistance $R_{13}$ is provided, although not particularly limited, between the base of bipolar transistor $Q_4$ and the power source voltage $V_{ee}$, while a capacitance $C_{a2}$ between the base of bipolar transistor $Q_4$ and the emitter of emitter follower transistor $Q_2$, namely the output terminal of the logic circuit $LOG_1$. Thereby, the resistance $R_{13}$ forms, together with the diode $D_1$, a constant voltage generating circuit which gives the predetermined base control voltage $V_{b3}$ to the base of bipolar transistor $Q_4$ and also forms, together with the capacitance $C_{a2}$, a differential circuit which sends level change at the output terminal to the base of bipolar transistor $Q_4$. Here, the resistance $R_{13}$ is designed to have a comparatively large resistance value and does not prevent power saving of the logic circuit $LOG_1$.

When the level of digital output signal $V_{i1}$ is fixed to the high level $V_H$ or low level $V_L$, a predetermined base control voltage $V_{b3}$ which is determined by the forward voltage $V_{DF1}$ of diode $D_1$ is supplied to the base of bipolar transistor $Q_4$. This base control voltage $V_{b3}$ is set, as in the case of the base control voltage $V_{b1}$ in the embodiment shown in FIG. 5, to the predetermined voltage value which applies a bias voltage $V_b$ to the base of pull-down transistor $Q_3$ so that it is set to a very weak ON condition. From these facts, the pull-down transistor $Q_3$ functions similar to the embodiment of FIG. 5 and thereby the logic circuit $LOG_1$ of this embodiment realizes low power consumption without giving influence on the high speed operation characteristic.

Here, a differential circuit consisting of the capacitance $C_{a2}$ and resistance $R_{13}$ is provided, as described above, between the output terminal of logic circuit $LOG_1$ of this embodiment and the base of bipolar transistor $Q_4$. This differential circuit sets the digital output signal $V_{o1}$ to the low level $V_L$, causes discharging of differential capacitance $C_{a1}$ and improves response characteristic for the pulsewise input signal.

As described, in the logic circuit $LOG_1$ of this embodiment, the diode $D_1$ is provided between the base of bipolar transistor $Q_4$ forming the bias circuit 4 and the power source voltage $V_{cc}$ and a capacitor $C_{a2}$ is provided between the base thereof and the output terminal of the logic circuit $LOG_1$. Moreover, the resistance $R_{13}$ which forms a constant voltage generating circuit together with the diode $D_1$ and forms a differential circuit together with the capacitance $C_{a2}$ is provided between the base of bipolar transistor $Q_4$ and the power source voltage $V_{ee}$.

This resistance $R_{13}$ is designed to have a comparatively large resistance value. Thereby, the logic circuit $LOG_1$ of this embodiment simplifies the constant voltage generating circuit for giving the predetermined base control voltage $V_{b3}$ to the base of bipolar transistor $Q_4$ and further improves response characteristic for the pulsewise input signal by feedback operation to be carried out through the bipolar transistors $Q_4$ and $Q_3$. As described above, since the resistances $R_4$ and $R_{13}$ are designed to have comparatively large resistance value, low power consumption of the logic circuit $LOG_1$ can be realized.

Figure 20:
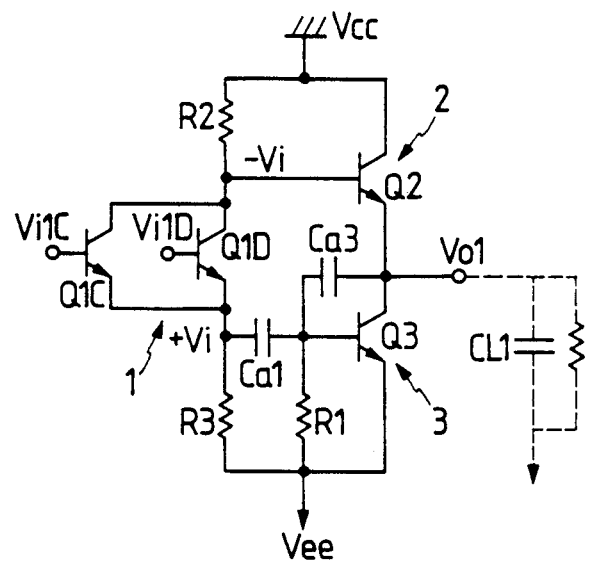
FIG. 20 is a circuit diagram indicating the second principle diagram of the first logic circuit to which the present invention is applied.

FIG. 20 is the second principle diagram of the logic circuit to which the present invention is applied.

In FIG. 20, this circuit is basically the same as the embodiment of FIG. 1 and the phase split circuit 1, emitter follower output circuit 2 and active pull-down circuit 3, etc. correspond to those in the embodiment of FIG. 1.

Following explanation will be made placing emphasis on difference from FIG. 1. In the same figure, the phase split circuit 1 is formed by the bipolar transistors $Q_{1C}$ and $Q_{1D}$ which receive the digital input signals $V_{i1C}$ and $V_{i1D}$. Moreover, even in case the logic of digital input signals $V_{i1C}$, $V_{i1D}$ changes to the high level $V_H$ and low level $V_L$ with a little time difference, the digital output signal $V_{o1}$ quickly responds to such change. Therefore, a capacitance $C_{a3}$ is provided for urging discharge operation of differential capacitance $C_{a1}$ for conductively driving the emitter load transistor $Q_3$.

Figure 21:
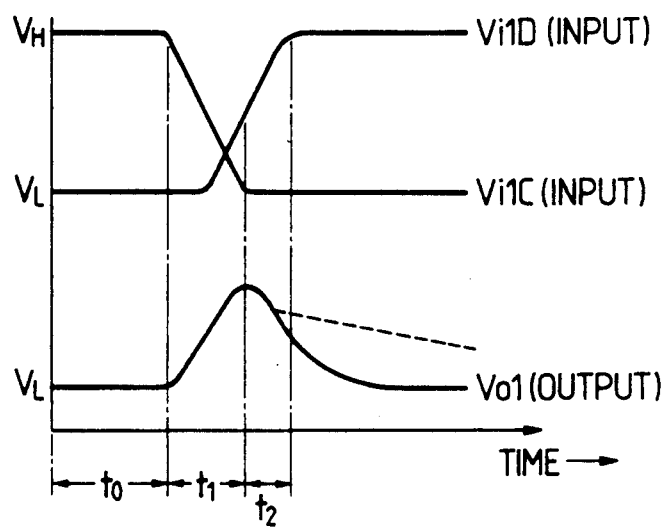
FIG. 21 illustrates waveforms indicating operation example of the first logic circuit shown in FIG. 20.

FIG. 21 illustrates the waveforms for explaining the operations of logic circuit $LOG_1$ shown in FIG. 20.

In the operation example of the same figure, since the logic of a pair of digital input signals $V_{i1C}$, and $V_{i1D}$ changes to the high level $V_H$ only with a little time difference, the digital output signal $V_{o1}$ becomes high level $V_H$ only within a very short period.

In FIG. 20 and FIG. 21, when, in the period t0 wherein the digital input signal $V_{i1c}$ and $V_{i1d}$ are respectively high level $V_H$ and low level $V_L$, the differential capacitance $C_{a1}$ is charged to the saturated condition, viewed from the side of phase split circuit 1, because the common emitter voltage of bipolar transistors $Q_{1C}$, $Q_{1D}$, namely the non-inverted output $+V_i$ of phase split circuit 1 is high level. Moreover, the capacitance $C_{a3}$ is in the non-charged condition viewed from the output side because the emitter voltage of emitter follower transistor $Q_2$, namely the digital output signal $V_{o1}$ is low level.

Next, in the period $t_l$ wherein the digital input signal $V_{i1C}$ changes to the low level $V_L$ from the high level $V_H$ and the digital input signals $V_{i1C}$ and $V_{i1D}$ become low level $V_L$, the non-inverted output $+V_i$ of the phase split circuit 1 falls to the low level from the high level and thereby, the differential capacitance $C_{a1}$ in the charging condition starts in turn the discharge operation. Simultaneously, since the emitter voltage of emitter follower transistor $Q_2$, namely the digital output signal $V_{o1}$ rises to the high level $V_H$ from the low level $V_L$, the capacitance $C_{a3}$ in the non-charging condition starts in turn the charging operation. That is, discharge operation of the differential capacitance $C_{a1}$ is accelerated by the charging operation of capacitance $C_{a3}$. As a result, the differential capacitance $C_{a1}$ charged is sufficiently discharged within a very short period from the timing where the non-inverted output $+V_i$ of the phase split circuit 1 falls to the low level from the high level.

Thereby, in the period $t_2$ where the digital input signal $V_{i1D}$ changes lo the high level $V_H$ from the low level $V_L$ and the non-inverted output $+V_i$ of phase split circuit 1 rises to the high level from the low level, the differential capacitance $C_{a1}$ allows the charging current to flow until sufficiently driving the pull-down transistor $Q_3$. Accordingly, the digital output signal $V_{o1}$ can immediately be lowered to the low level from the high level.

Here, if the capacitance $C_{a3}$ is not provided, since the period $t_1$ in which the logical OR of the digital input signals $V_{i1C}$ and $V_{i1D}$ becomes the low level is very short period, the differential capacitance $C_{a1}$ cannot sufficiently discharge the electric charge charged when the non-inverted output $+V_i$ is high level. Therefore, in the period in which the non-inverted output $+V_i$ changes to the high level from the low level, namely in the period $t_2$ in which the digital output signal $V_{o1}$ changes to the low level from the high level, the differential capacitance $C_{a1}$ can no longer supply the sufficient charging current to the base of pull-down transistor $Q_3$. As a result, as indicated by a dotted line in FIG. 21, level shift to the low level of the digital output signal $V_{o1}$ is much delayed.

As described above, even when the digital input signals $V_{i1C}$ and $V_{i1D}$ of the logic circuit $LOG_1$ of the embodiment shown in FIG. 20 change within a very short period, such level change can be sent certainly to the digital output signal $V_{o1}$.

Figure 22:
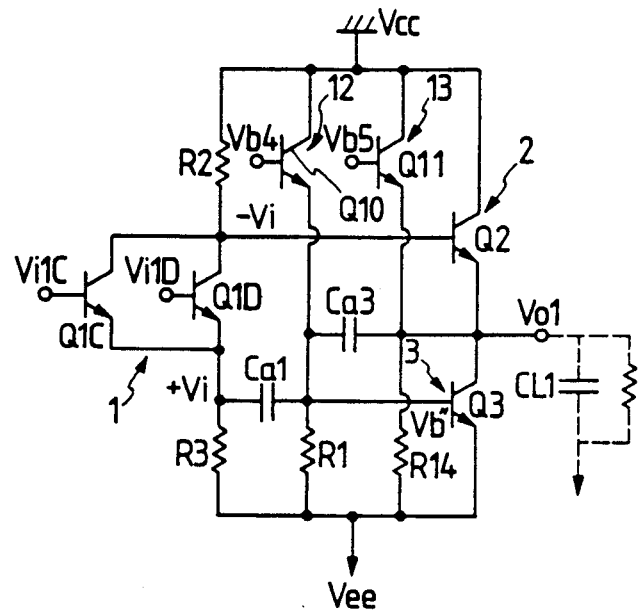
FIG. 22 is a circuit diagram for realizing the second principle diagram of the first logic circuit shown in FIG. 20.

FIG. 22 indicates an embodiment for realizing the logic circuit $LOG_1$ shown in FIG. 20 by the present invention. Focusing on the difference from FIG. 20, in the logic circuit $LOG_1$ of the embodiment shown in the same figure, a clamp circuit 13 which rejects overshoot of digital output signal $V_{o1}$ in the negative voltage side like the clamp circuit 8 shown in FIG. 14 and a resistance $R_{14}$ for assuring the level of digital output signal $V_{o1}$ like the high resistance $R_4$ shown in FIG. 5 are provided, together with the bias circuit 12 which biases the pull-down transistor $Q_3$ in the steady state to the condition immediately before the conductive condition like the bias circuit shown in FIG. 5. Like the circuit of FIG. 5, the bias circuit 12 is configured by the bipolar transistor $Q_{10}$ to which the predetermined base control voltage $V_{b4}$ supplied from the external or internal circuit of the cell formed by the logic circuit $LOG_1$ and the predetermined bias voltage $V_{b'}$, is supplied to the base of pull-down transistor $Q_3$ by applying the predetermined bias current to the resistance $R_1$ connected in parallel to the base of pull-down transistor $Q_3$. Like the bias voltage $V_b$ shown in FIG. 5 and FIG. 6, the predetermined bias voltage $V_{b'}$, is a voltage value for setting the pull-down transistor $Q_3$ to the very weak ON condition, namely a voltage value which results in the collector current $Ic3$ of the pull-down transistor of about 10–100 $\mu$A.

The clamp circuit 13 is formed by the bipolar transistor $Q_{11}$ to which the predetermined base control voltage $V_{b5}$ is applied like the circuit shown in FIG. 14 and the voltage of digital output signal $V_{o1}$ is boosted exceeding the predetermined low level $V_L$ by the emitter follower operation of the bipolar transistor $Q_{11}$.

Figure 23:
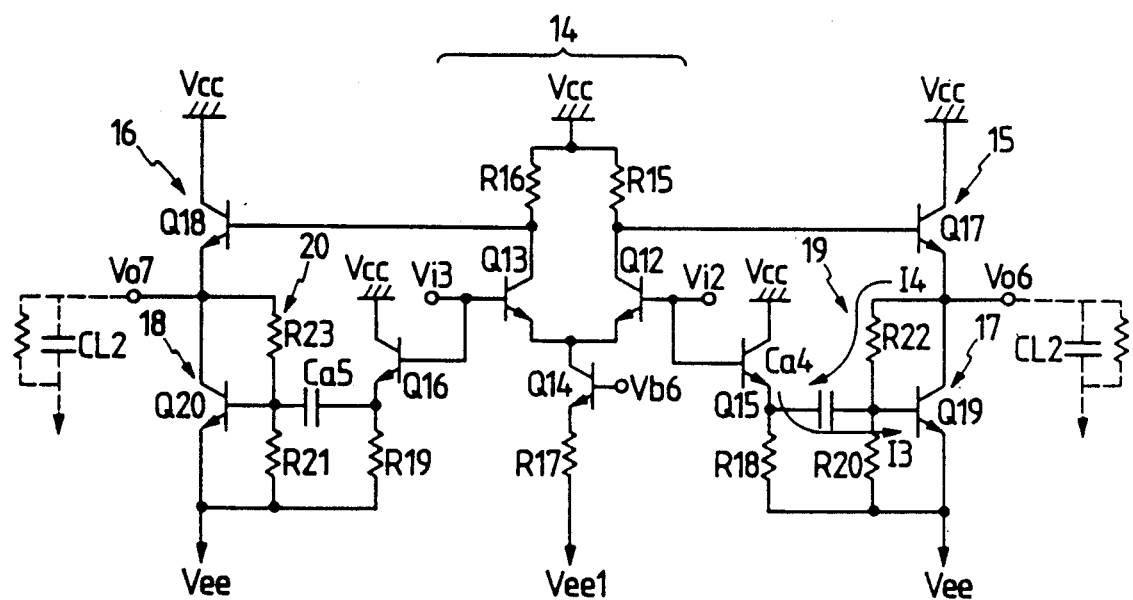
FIG. 23 is a circuit diagram indicating the second logic circuit to which the present invention is applied.

FIG. 23 indicates an embodiment of the second logic circuit to which the present invention is applied.

In FIG. 23, the logic circuit $LOG_3$ is formed by the phase inverting circuit 14 which receives the complementary digital input signals $V_{i2}$, $V_{i3}$ and outputs the phase-inverted digital input signals $V_{i2}$, $V_{i3}$, emitter follower output circuits 15, 16 which are driven by outputs of the phase inverting circuit 14, active pull-down circuits 17, 18, differential capacitances $C_{a4}$, $C_{a5}$ for differentiating rising edges of the digital input signals $V_{i2}$, $V_{i3}$ supplied through bipolar transistors $Q_{15}$, $Q_{16}$, and bias circuits 19, 20.

The phase inverting circuit 14 is formed by the bipolar transistors $Q_{12}$–$Q_{14}$ and resistances $R_{15}$–$R_{17}$, the predetermined base control voltage $V_{b6}$ (for example, 1.85 V) is supplied to the base of bipolar transistor $Q_{14}$ and thereby it forms a constant current circuit together with the resistance $R_{17}$. As described the phase inverting circuit 14 inverts the phase of the complimentary digital input signals $V_{i2}$, $V_{i3}$ and outputs such signals to the emitter follower output circuits 15, 16.

The emitter follower output circuits 15, 16 are respectively formed by the emitter follower transistors $Q_{17}$, $Q_{18}$. The emitters of emitter follower transistors $Q_{17}$, $Q_{18}$ are respectively connected to the power source voltage $V_{ee}$ through the pull-down transistors $Q_{19}$, $Q_{20}$ described later and also connected to the load capacitance $CL_2$ generated equivalently by the distributed capacitance of the output wirings.

The active pull-down circuits 17, 18 are respectively formed by the pull-down transistors $Q_{19}$, $Q_{20}$. The pull-down transistors $Q_{19}$, $Q_{20}$ are emitter loads of the emitter output circuits 15, 16 and switchingly connect the output of emitter follower transistors $Q_{17}$, $Q_{18}$, namely the digital output signals $V_{o6}$, $V_{o7}$ of the logic circuit $LOG_3$ respectively to the power source voltage $V_{ee}$.

The differential capacitances $C_{a4}$, $C_{a5}$ differentiate the in-phase signals of the digital input signals $V_{i2}$, $V_{i3}$ supplied through the bipolar transistors $Q_{15}$, $Q_{16}$. When the respective digital input signals $V_{i2}$, $V_{i3}$ rise to the high level from the low level and conductively drive the pull-down transistors $Q_{19}$, $Q_{20}$ temporarily.

The bias circuits 19, 20 comprise the resistances $R_{22}$, $R_{23}$ which feed the voltages of digital output signals $V_{o6}$, $V_{o7}$ back to the bases of pull-down transistors $Q_{19}$, $Q_{20}$ and the resistances $R_{20}$, $R_{21}$ which pull down the bases of pull-down transistors $Q_{19}$, $Q_{20}$ to the side of emitter.

The bipolar transistors $Q_{15}$, $Q_{16}$ form the emitter follower to the respective digital input signals $V_{i2}$, $V_{i3}$, buffer-amplify the digital input signals $V_{i2}$, $V_{i3}$ in the in-phase condition and then sends such signals to the differential capacitances $C_{a4}$, $C_{a5}$.

As described previously, the power source voltages $V_{ee}$, $V_{ee1}$ are negative power source voltages and set, for example, to $-2$ V, $-3$ V, respectively. In addition, the power source voltage $V_{cc}$ is the ground potential as described previously.

Operations of logic circuit $LOG_3$ thus configurated as described above will be explained hereunder.

In FIG. 23, when the digital input signal $V_{i2}$ is low level, the base input of the emitter follower transistor $Q_{17}$ of the emitter follower output circuit 15 becomes high level. Thereby, the emitter follower transistor $Q_{17}$ is conductively driven and the digital output signal $V_{o6}$ becomes high level. In this timing, the pull-down transistor $Q_{19}$ keeps the non-conductive condition.

Here, when the digital input signal $V_{i2}$ changes to the high level from the low level, the base input of the emitter follower transistor $Q_{17}$ becomes the low level from the high level and the emitter follower transistor $Q_{17}$ is changed to the non-conductive condition from the conductive condition. In this case, when the digital input signal $V_{i2}$ rises to the high level from the low level, a charging current $I_3$ of the differential capacitance $C_{a4}$ flows into the pull-down transistor $Q_{19}$.

Accordingly, the pull-down transistor $Q_{19}$ becomes conductive temporarily while the emitter follower transistor $Q_{17}$ changes to the conductive condition from the non-conductive condition, forcing the charges of load capacitance $CL_2$ to quickly discharge. Thereby, the digital output signal $V_{o6}$ immediately falls to the low level from the high level after the digital input signal $V_{i2}$ changes to the high level from the low level.

In the same way, the digital output signal $V_{o7}$ also falls immediately to the low level from the high level after the digital input signal $V_{i3}$ changes to the high level from the low level.

As described previously, when the digital output signals $V_{o6}$, $V_{o7}$ fall to the low level from the high level, the pull-down transistors $Q_{19}$, $Q_{20}$ are temporarily set to the conductive condition with the differential output. Thereby, the load capacitance $CL_2$ is forced to discharge and the digital output signals $V_{o6}$, $V_{o7}$ quickly fall. In other cases, the pull-down transistors $Q_{19}$, $Q_{20}$ are kept at the non-conductive condition and a current steadily consumed is kept small.

Further, in the logic circuit $LOG_3$, the base bias condition of pull-down transistors $Q_{19}$, $Q_{20}$ changes depending on the load condition of the digital output signals $V_{o6}$, $V_{o7}$. Namely, when a load capacitance $CL_2$ is still charged with remaining charges, the conductive driving level of the pull-down transistors $Q_{19}$, $Q_{20}$ is enhanced because the high voltage by the remaining charges increases the base bias level of the pull-down transistors $Q_{19}$, $Q_{20}$. Thereby, the pull-down effect, namely the effect of lowering the digital output signals $V_{o6}$, $V_{o7}$ can also be enhanced.

In addition, when the digital output signals $V_{o6}$, $V_{o7}$ are high level, a charging current $I_4$ is supplied to charge the differential capacitances $C_{a4}$, $C_{a5}$ through the resistances $R_{23}$, $R_{24}$ from the side of digital output signals $V_{o6}$, $V_{o7}$. Therefore, the charging current for driving the pull down transistors $Q_{19}$, $Q_{20}$ from the differential capacitances $C_{a4}$, $C_{a5}$ also increases by DC feedback of the voltage of digital output signals $V_{o6}$, $V_{o7}$ to the base to pull-down transistors $Q_{19}$, $Q_{20}$.

Thereby, good falling characteristic of the logic circuit $LOG_3$ comprising the emitter follower output circuits 15, 16 can be obtained without relation to change of load capacitance $CL_2$.

Figure 24:
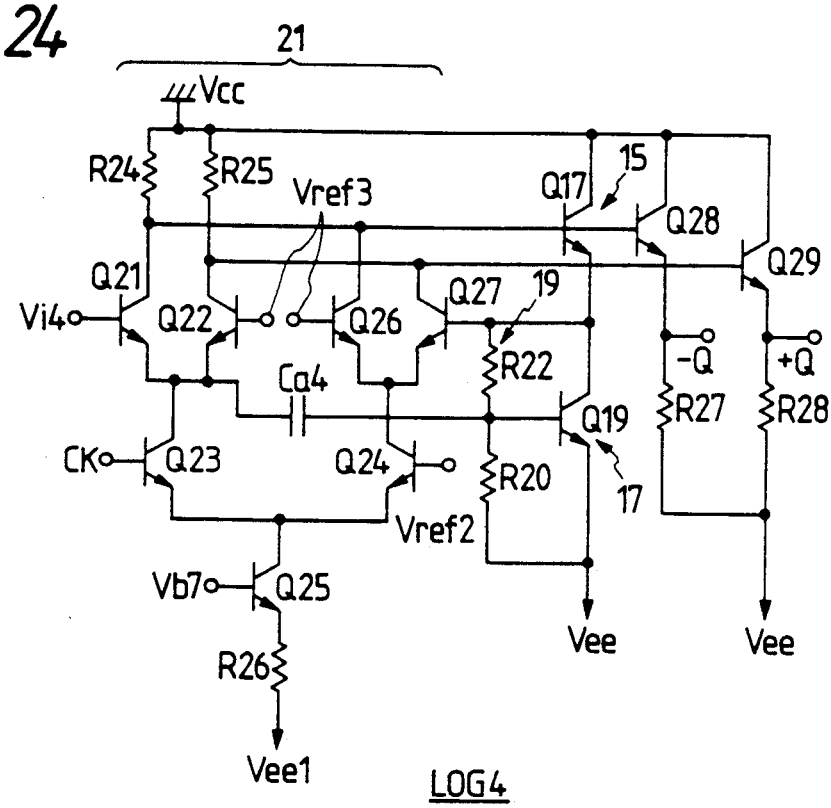
FIG. 24 is a circuit diagram indicating the third logic circuit to which the present invention is applied.

FIG. 24 shows an embodiment indicating a third logic circuit to which the present invention is applied.

In FIG. 24, the emitter follower output circuit 15, active pull-down circuit 17, bias circuit 19 and differential capacitance $C_{a4}$ correspond to those of embodiment shown in FIG. 23 and operate in the same way.

Moreover in FIG. 24, the logic circuit $LOG_4$ is formed by the D latch circuit 21 which is configurated using the clocked gate by the 2-stage cascade differential circuit consisting of the bipolar transistors $Q_{21}$–$Q_{25}$ and resistances $R_{24}$–$R_{26}$ and emitter follower output circuit formed by the bipolar transistors $Q_{28}$, $Q_{29}$ which provide outputs of D latch circuit 14 as the latch outputs $Q$, $\overline{Q}$, and the resistances $R_{27}$, $R_{28}$.

The D latch circuit 21 executes the D latch operations by the internal feedback of outputs of clocked gate through the emitter follower by the emitter follower transistor $Q_{17}$. The bipolar transistor $Q_{25}$ forms a constant current source, together with the resistance $R_{26}$, by receiving the predetermined base control voltage $V_{b7}$ (for example, $-1.85$ V). The digital input signal $V_{i4}$ is data input; CK is clock input; $+Q$, $-Q$ are latch outputs; $V_{ref2}$, $V_{ref3}$ are reference voltages and $V_{ee1}$, $V_{ee}$ are negative power source voltages.

Here, the emitter of emitter follower transistor $Q_{17}$ forming the emitter follower output circuit 15 within the D latch circuit is connected with the pull-down transistor $Q_{19}$. In addition, the base of pull-down transistor $Q_{19}$ is self-biased, as in the case of the embodiment of FIG. 23, with the resistance $R_{22}$ and receives the charging current of the differential capacitance $C_{a4}$ from the side of D latch circuit 21.

Thereby, the D latch circuit 21 of the logic circuit $LOG_4$ described above is capable of executing the high speed data latch operation by improvement of falling characteristic of the emitter follower output circuit 15 provided in the feedback path in such D latch circuit 21. Moreover, since the bipolar transistor $Q_{21}$ and pull-down transistor $Q_{19}$ are resistive to the α-ray like the bipolar transistor $Q_1$ and pull-down transistor $Q_3$ shown in FIG. 1, the D latch circuit 21 executes highly reliable holding operation.

Figure 25:
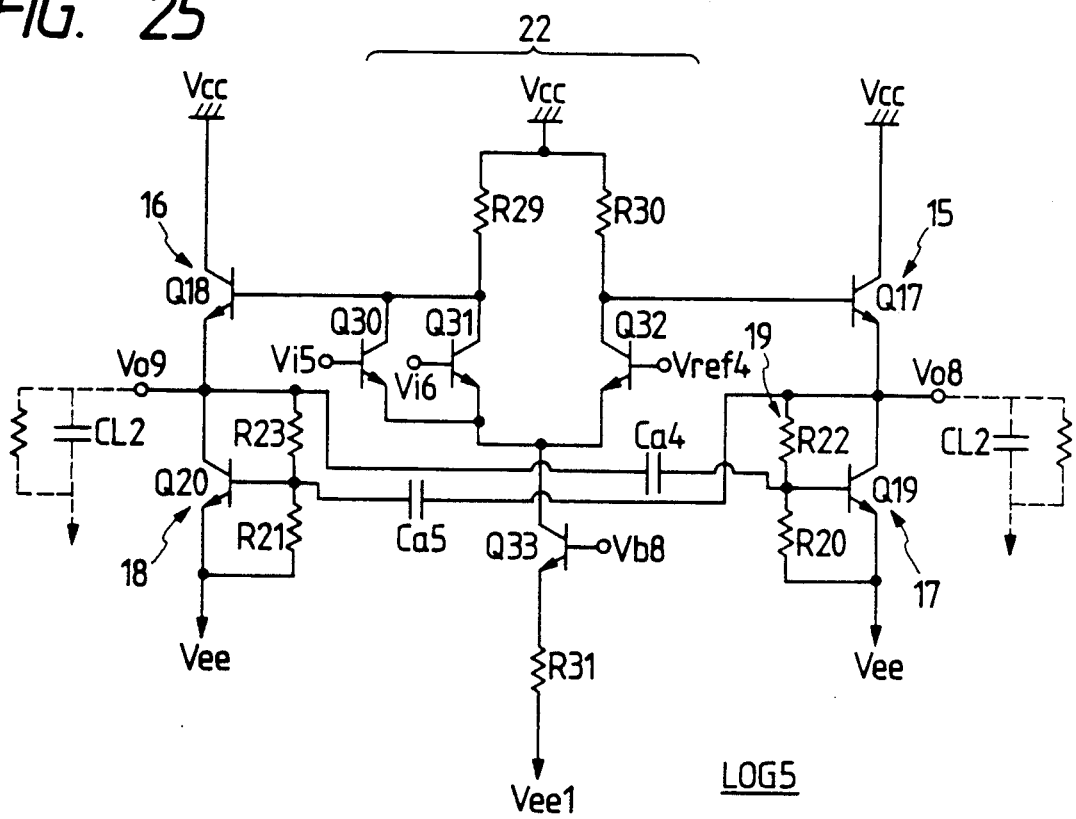
FIG. 25 is a circuit diagram indicating a fourth logic circuit to which the present invention is applied.

FIG. 25 shows an embodiment of the fourth logic circuit to which the present invention is applied.

In FIG. 25, the emitter follower output circuits 15, 16, active pull down circuits 17, 18, bias circuits 19, 20, differential capacitances $C_{a4}$, $C_{a5}$ respectively correspond to those of embodiment shown in FIG. 23 and operate in the same way.

Referring to FIG. 25, the logic circuit $LOG_4$ is formed by a current switching circuit 22 consisting of the bipolar transistors $Q_{30}$–$Q_{31}$ and resistances $R_{29}$–$R_{31}$, emitter follower output circuits 15, 16 respectively providing output of the current switching circuit, active pull-down circuits 17, 18, bias circuits 19, 20 and differential capacitances $C_{a4}$, $C_{a5}$.

The current switching circuit 22 provides an output respectively to the emitter follower transistors $Q_{17}$, $Q_{18}$ in accordance with the digital input signals $V_{i5}$, $V_{i6}$ and reference voltages $V_{ref4}$. The bipolar transistor $Q_{33}$ receives the predetermined base control voltage $V_{b8}$ (for example, 1.85 V) and forms a constant current source in combination with the resistance $R_{32}$. As described above, output of current switching circuit 22 is output by the emitter follower of the emitter follower transistors $Q_{17}$, $Q_{18}$ as the digital output signals $V_{o8}$, $V_{o9}$.

Respective digital output signals $V_{o8}$, $V_{o9}$ are connected by switching to the power source voltage $V_{ee}$ in the low level side by the pull-down transistors $Q_{19}$, $Q_{29}$.

On the other hand, the differential capacitance $C_{a4}$ differentiates the rising edge of digital output signal $V_{o9}$ and supplies the charging current to the base of pull-down transistor $Q_{19}$ to temporarily drive the transistor. Meanwhile, the differential capacitance $C_{a5}$ differentiates the rising edge of digital output signal $V_{o10}$ and supplies the charging current to the base of pull-down transistor $Q_{20}$ in order to temporarily drive the transistor.

Moreover, in the pull-down transistors $Q_{19}$, $Q_{20}$, the bias is applied depending on the load capacitance $CL_2$ by the feedback of the voltage of digital output signals $V_{o8}$ $V_{o9}$ to the base through the resistance $R_{22}$, $R_{23}$ and by the pull-down of the base to the emitter side through the resistances $R_{20}$, $R_{21}$, and simultaneously the differential output generated when the differential capacitances $C_{a4}$, $C_{a5}$ are charged respectively to the digital output signals $V_{o8}$, $V_{o9}$, is enhanced because the differential capacitances $C_{a4}$, $C_{a5}$ are charged from the side of digital output signals $V_{o8}$, $V_{o9}$ when the these digital output signals are high level.

Thereby, as in the case of the embodiment of FIG. 23 described above, the rising characteristic of the digital output signals $V_{o8}$, $V_{o9}$ output as the complementary signal can be improved.

Figure 26:
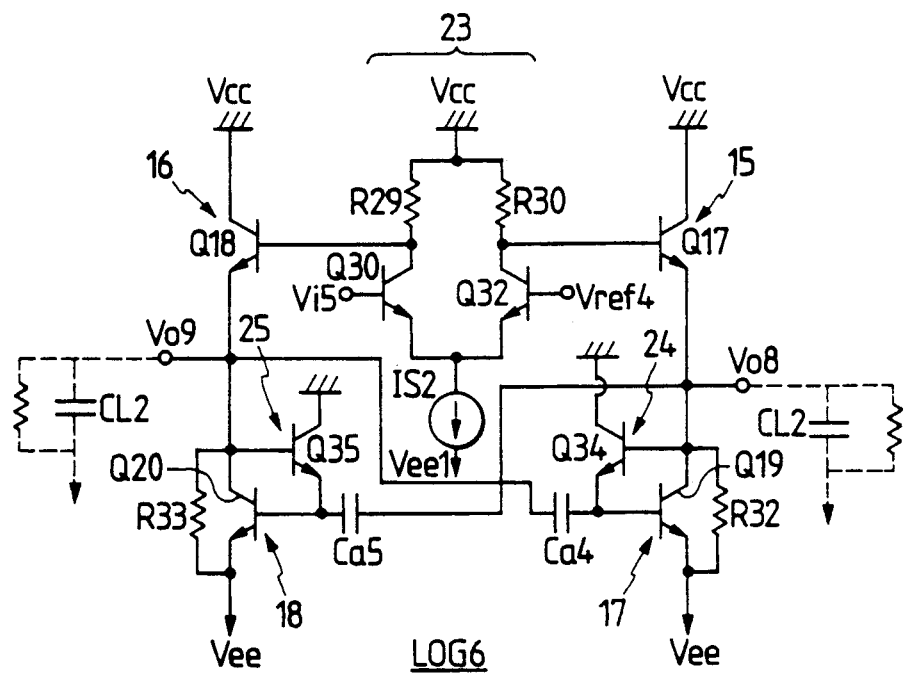
FIG. 26 is a circuit diagram indicating the fifth logic circuit to which the present invention is applied.

FIG. 26 indicates an embodiment of the fifth logic circuit to which the present invention is applied.

In FIG. 26, the logic circuit $LOG_6$ is a modification of the embodiment shown FIG. 25 and has the same basic configuration. Explanation will be made focusing on the difference from FIG. 25. The logic circuit $LOG_6$ includes the complementary signal circuit 23 in which the digital input signals $V_{i5}$, $V_{i6}$ are negative input of $V_{i5}$ and the complementary signal can be formed by high level or low level of the digital input signal $V_{i5}$ and the constant current source which is formed by the bipolar transistor $Q_{31}$ and resistance $R_{31}$ shown in FIG. 25 is designated by $IS_2$. Moreover, the bias circuits 24, 25 are formed by the bipolar transistors $Q_{34}$, $Q_{35}$ in place of the resistances $R_{22}$, $R_{23}$ different from the bias circuits 19, 20 of the embodiment shown in FIG. 25 and the resistances $R_{20}$, $R_{21}$ shown in FIG. 25 are indicated as the resistances $R_{33}$, $R_{32}$.

Figure 28:
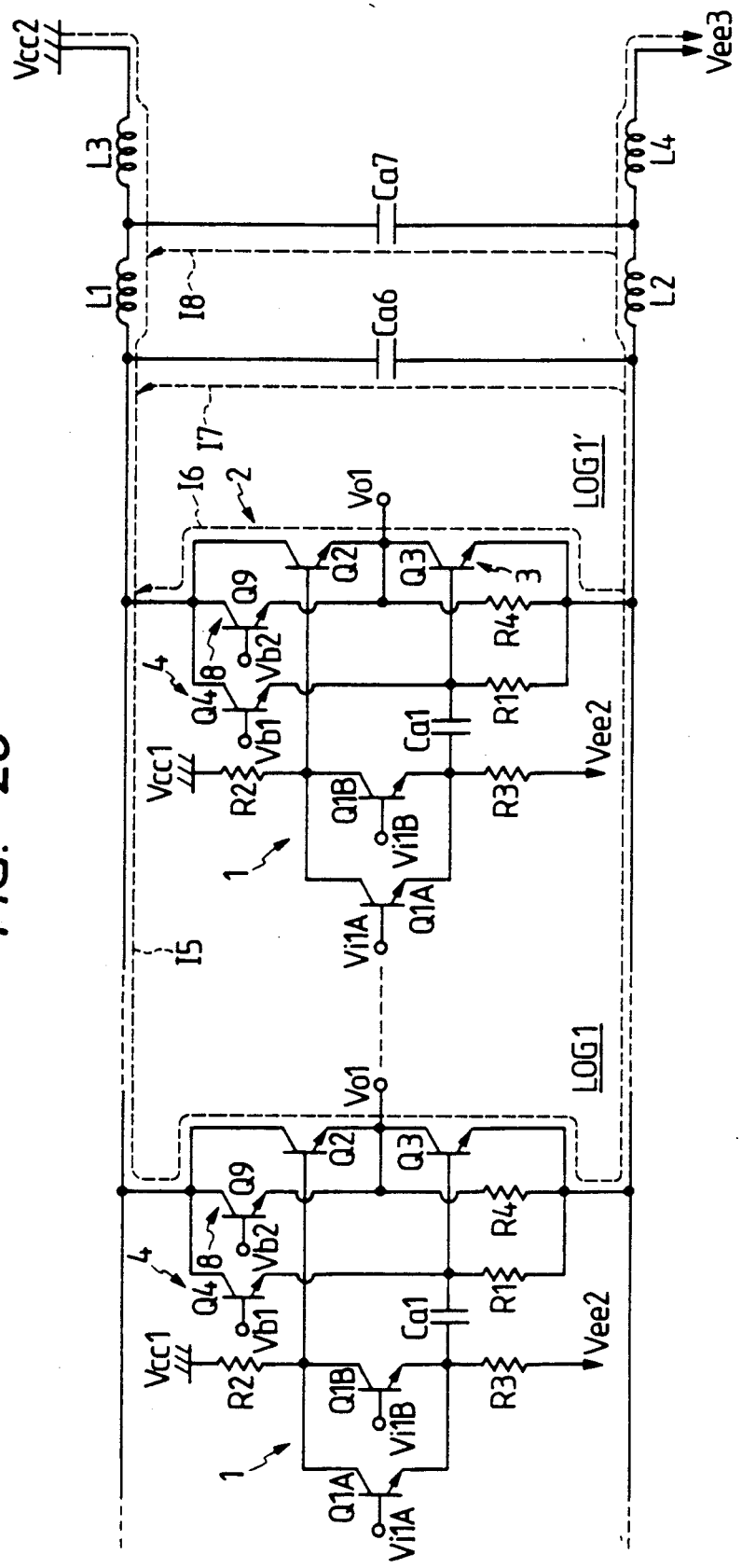
FIG. 28 is a circuit diagram forming a cell of a large capacity gate array integrated circuit shown in FIG. 27 with the first logic circuit.
Figure 29:
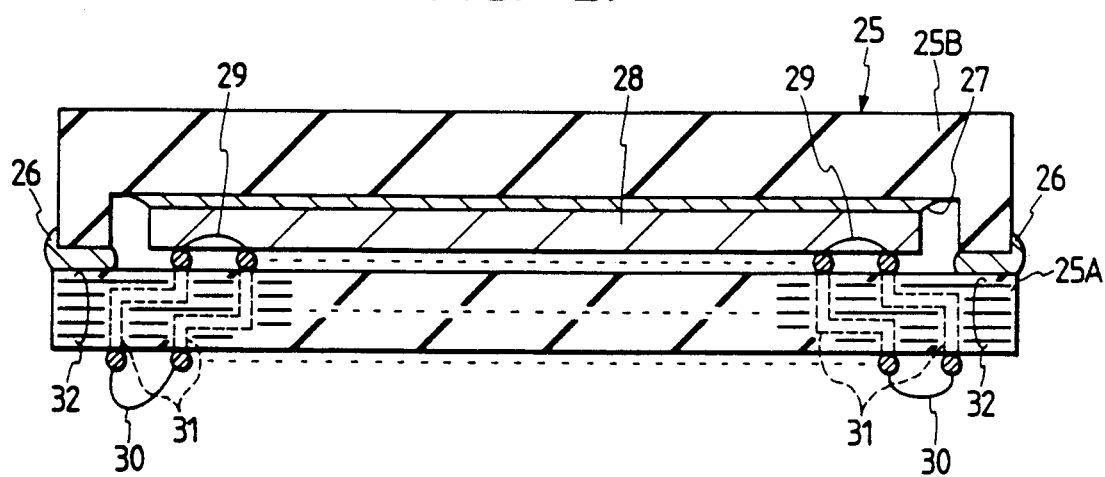
FIG. 29 is a sectional view of a large capacity gate array shown in FIG. 28 sealed by microchip carrier.

FIG. 27 is a schematic plan view of a large capacity gate array integrated circuit to which the present invention is applied. FIG. 28 indicates an embodiment in which the cell of large capacity gate array integrated circuit of FIG. 27 is designated by the logic circuit $LOG_1$ of FIG. 14. FIG. 29 indicates a sectional view of the semiconductor chip forming a large capacity gate array integrated circuit shown in FIG. 27 sealed with the microchip carrier.

Figure 30:
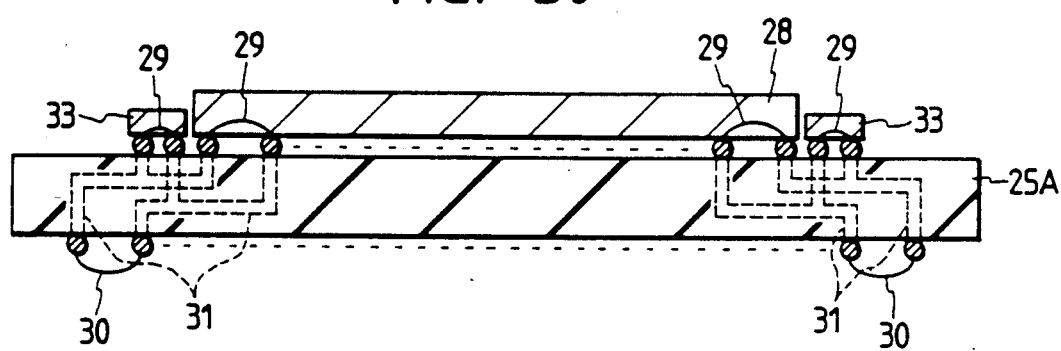
FIG. 30 is a sectional view forming a capacitance chip on the carrier shown in FIG. 29.
Figure 31:
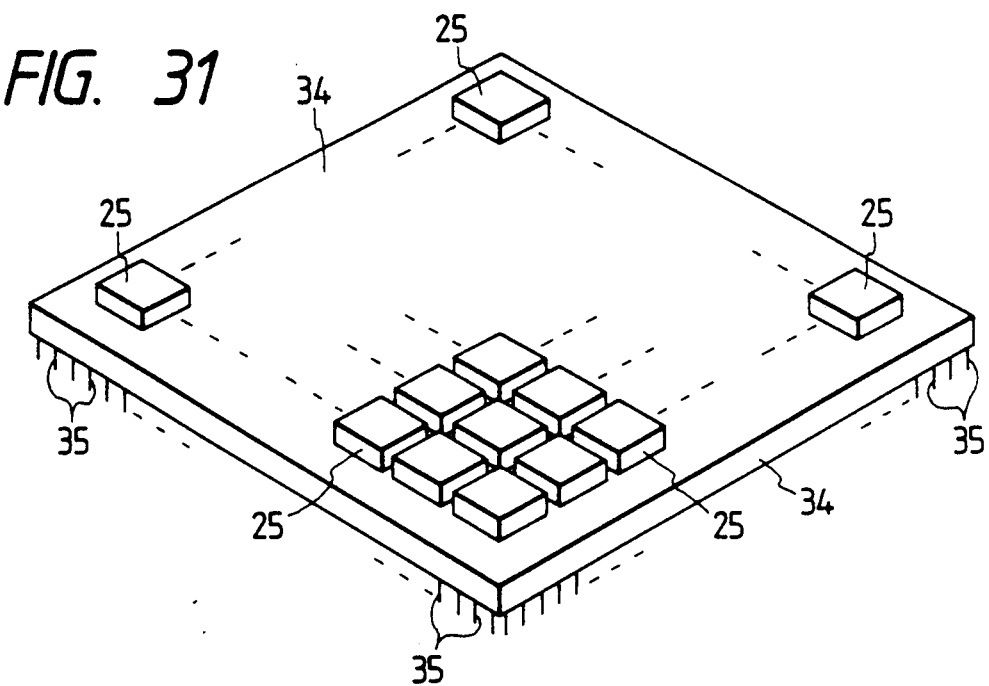
FIG. 31 is diagram indicating mounting of a microchip carrier shown in FIG. 29 on a mounting substrate.
Figure 32:
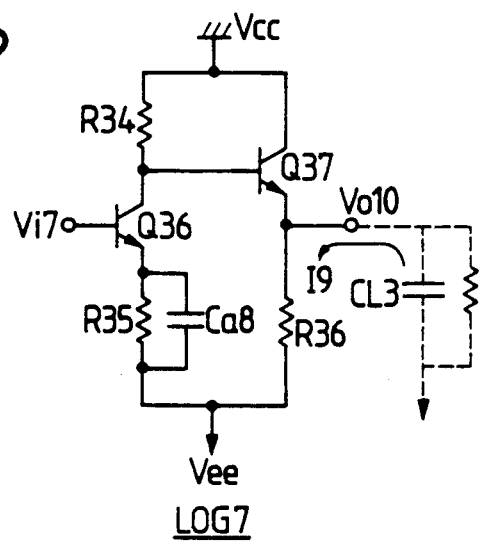
FIG. 32 is a circuit diagram indicating an configuration example of the logic circuit discussed prior to the present invention.
Figure 33:
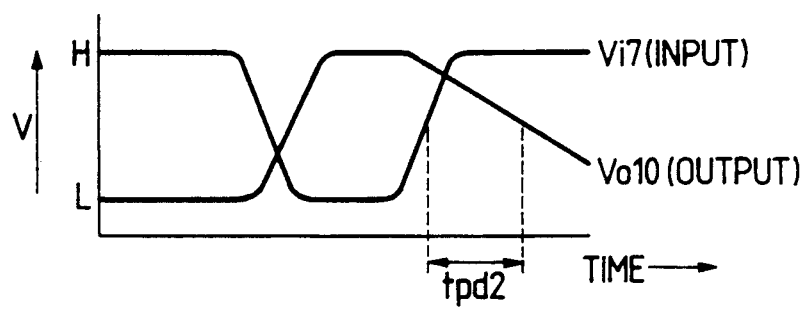
FIG. 33 illustrates waveforms indicating operation example of the logic circuit shown in FIG. 32.

FIG. 30 indicates a sectional view in which a capacitance chip is formed on the carrier shown in FIG. 29. FIG. 31 shows that the microchip carrier shown in FIG. 29 is mounted on the mounting substrate.

In FIG. 27, a large capacity gate array GA allows, although not particularly limited, arrangement of many basic cells at the internal side of input/output buffer region I/O formed by the ECL circuit. Each basic cell forms the logic circuit, for example, the logic circuit $LOG_1$ shown in FIG. 5, FIG. 8, FIG. 10, FIG. 14, FIG. 16, FIG. 18, FIG. 19, FIG. 22, logic circuits $LOG_3$–$LOG_6$ shown in FIG. 23–FIG. 26 or logic circuit $LOG_2$ shown in FIG. 13. The unused cell cell' of the basic cells is the capacitive cells in order to prevent malfunction under the steady state of the pull-down transistor shown in the explanation for FIG. 14. Moreover, in the large capacity gate array integrated circuit GA, the capacitive element CE is formed between the basic cells Cell in order to prevent malfunction described above. Moreover, the large capacity gate array GA is provided with a base control voltage generating circuit 24 in order to form the base control voltage $V_{b1}$ ($V_{b4}$) in accordance with the control voltage $V_c$ supplied from the external terminal. In case the logic circuit of each embodiment is formed with the large capacity gate array integrated circuit GA, many logic circuits can be formed with high density due to the high speed operation characteristic and low power consumption characteristic. In addition, since the wired logic can be formed, the application efficiency of the logic circuit can be remarkably enhanced and a very large scale and high performance semiconductor integrated circuit device can be obtained efficiently with the gate array configuration.

In FIG. 28, the left logic, circuit is designated as $LOG_1$, while the right logic circuit as $LOG_{1'}$. Many logic circuits $LOG_1$ are connected between the power source voltage $V_{cc2}$ and $V_{ee3}$. Moreover, the inductances $L_1$, $L_2$ are inductance of CCB bump electrode 29 shown in FIG. 29, while the inductances $L_3$, $L_4$ are inductance of carrier 25A shown in FIG. 29. Moreover, the capacitance $C_{a6}$ is the capacitance in the chip and is equal to the capacitance of the capacitance element CE and unused cell cell' shown in FIG. 27 and the capacitance $C_{a7}$ is the capacitance of carrier 25A shown in FIG. 29, namely the layered capacitance 32 or capacitance chip 33 shown in FIG. 29 and FIG. 30.

In FIG. 28, when the digital output signal $V_{o1}$ of logic $LOG_1$ falls to the low level from the high level, the pull-down transistor $Q_3$ is temporarily driven conductively as described previously. In this case, since the emitter follower transistor $Q_2$ is not yet sufficiently driven non-conductively, a current $I_5$ temporarily flows. The power source voltage $V_{ee3}$ changes according to being flown the current $I_5$ to the inductances $L_1$, $L_2$, $L_3$ and $L_4$ therefore the pull-down transistor $Q_3$ is conductively driven due to change of emitter voltage of such pull-down transistor $Q_3$ at the steady state of the logic circuit connected to the power source voltages $V_{cc2}$ and $V_{ee3}$, for example, the logic circuit $LOG_{1'}$, resulting in possibility of malfunction. However, in this embodiment, many logic circuits $LOG_1$ are connected between the power source voltages $V_{cc2}$ and $V_{ee3}$. The pull-down transistor $Q_3$ under the steady state of the logic circuit $LOG_1$ is in the very weak ON condition and the collector current $I_{c3}$ is about 10–100 μA as described previously. Moreover, since the emitters of pull-down transistors $Q_3$ of a plurality of logic circuits $LOG_1$ are connected in common to the power source voltage $V_{ee3}$, a kind of emitter coupled circuit is formed. In addition, a small number of pull down transistors $Q_3$ are conductively driven simultaneously in the large capacity gate array GA. Therefore, since a part of through current $I_5$ flows onto a loop like the current $I_6$, the through current flowing into the inductances $L_1$, $L_2$, $L_3$ and $L_4$ decreases, suppressing variation of power source voltage $V_{ee3}$. However, since the logic circuit $LOG_1$ is a super high speed circuit, variation of power source voltage $V_{ee3}$ is suppressed and moreover the chip capacitance $C_{a6}$ of the large capacity gate array integrated circuit GA and the capacitance $C_{a7}$ of the carrier 25A shown in FIG. 29 and FIG. 30 are formed in the large CapaCity gate array integrated circuit GA of this embodiment. A part of the through current $I_5$ further flows on the loop like the current $I_6$, $I_7$, $I_8$ and thereby variation of power source voltage $V_{ee3}$ is suppressed.

In FIG. 29, 25 designates microchip carrier; 25A, carrier for mounting chip; 25B, cap; 26, 27, solder; 28, semiconductor chip; 29, CCB (Controlled Collapse Bonding) bump electrode; 30, bump electrode for mounting; 31, wiring. The arrow mark at the end of leader line indicates the entire part of microchip carrier 25.

The CCB bump electrode 29 is connected to the input/output terminal of gate array integrated circuit GA and power source terminals of power source voltages $V_{cc}$ and $V_{ee}$ and is also connected to the bump electrode 30 for mounting through the wiring 31.

The microchip carrier 25 of this embodiment forms a layered capacitance 32 on the chip mounting carrier 25A in order to prevent malfunction under the steady state of the pull-down transistor $Q_3$.

The CCB bump electrode 29 is described in the Japanese Laid-open Patent No. 62-249429 and the microchip carrier 25 is described in the Japanese Patent Application No. 62-146397.

In FIG. 30, the basic configuration is the same as that of microchip carrier 25 shown in FIG. 29. Focusing on difference from the microchip carrier 25 of FIG. 29, this embodiment prevents malfunction of the pull-down transistor $Q_3$ under the steady state by not forming the layered capacitance 32 on the carrier 25A, forming the capacitance chip 33 on the carrier 25A and connecting such chip to the wiring 31 through the CCB bump electrode 29.

In FIG. 31, 34 designates a mounting substrate; 35 is pin. Many microchip carriers 25 are mounted on the substrate 34 as shown in FIG. 31. The mounting bump electrode 30 is connected to the pin 35 by a plurality of wired layers (not illustrated) included in the substrate 31. The substrate 34 is sealed by the cap, although not illustrated.

As described, in the large capacity gate array integrated circuit GA of this embodiment, a plurality of logic circuits $LOG_1$ are provided between the power source voltages $V_{cc2}$ and $V_{ee3}$ in order to prevent malfunction of the pull-down transistor $Q_3$ under the steady state due to variation of the power source voltage $V_{ee3}$. In addition, such malfunction can be further prevented by forming capacitance on the chip 28 and carrier 25A. Moreover, such malfunction is prevented more successfully by sealing the package of the large capacity gate array integrated circuit GA by the method in which the microchip carrier 25 is sealed using the CCB bump electrode 29 having smaller inductance than that in the method using the lead wire. Moreover, since the base control voltage $V_{b1}$ ($V_{b4}$) of the bias circuits 4 and 8 and bipolar transistors $Q_4$ and $Q_{10}$ can be controlled by changing the control voltage VC shown in FIG. 27. Accordingly, the falling time of the digital output signal $V_{o1}$ of the logic circuit $LOG_1$ can be delayed, for testability of the large capacity gate array integrated circuit GA, by controlling the bias voltage $V_b$ ($V_{b''}$) of the pull-down transistor $Q_3$.

As explained in the embodiments above, in case the present invention is applied to the large capacity gate array or high speed logic integrated circuit basically configurated by the NTL circuit or ECL circuit, following effects can be obtained.

(1) The load means can be temporarily short-circuitted at the beginning of the low level output and level of output signal can be changed quickly by providing the pull-down transistor which is capacitively connected to the emitter of the transistor receiving the input signal at its base and temporarily shows a large conductance for the low level output.

(2) With the item (1), following effect can be obtained. Namely, good response characteristic of input pulse to the NTL circuit can be obtained and level change at the rising and falling edges is almost equal. The high load driving capability for the NTL circuit can be realized and the output signal in the range from light to heavy load can be changed quickly by forced removable of capacitance of load means for the low level output with the pull-down transistor. Since the pull-down transistor such as NTL circuit shows high impedance under the steady state, a wired OR circuit which does not easily generate electromigration can be formed. Employment of the NTL circuit having the configuration indicated in the item (1) results in resistivity to the α-ray. With use of the NTL circuit of the configuration described above, the pull-down transistor can be formed without use of a particular element such as PNP transistor and output signal level can be changed quickly. Since the pull-down transistor can be formed on a single semiconductor substrate together with the other circuit elements, high speed level change of the output signal can be realized by the device technology. Since the NTL circuit is a low amplitude circuit, operation rate can further be improved. Low power consumption of the NTL circuit can be attained by making large the resistance value of load means and making small an operation current of the output emitter follower circuit.

(3) Following effects can be obtained from the items (1) and (2). The NTL circuit is a low voltage circuit and low power consumption can also be realized for the NTL circuit. Since the rising and falling times of output signal are almost equal, simplified delay calculation of the NTL circuit can be realized easily and dependence on the input waveform of the circuit operation rate of NTL circuit can be reduced. The load driving capability of the NTL circuit can further be improved by providing the bias circuit to the base of pull-down transistor of the NTL circuit of the configuration described above. The low power consumption can also be realized without interfering the high speed operation of the NTL circuit.

(4) Following effects can be obtained from the items (1) to (3). The load driving capability of NTL circuit and falling rate of output signal can be set adequately by providing adequate capacitance between the pull-down transistor and the transistor receiving the input signal. The load driving capability of NTL circuit and falling rate of output signal can be changed by configurating the bias circuit with the transistor to be controlled with the predetermined base voltage and changing the predetermined base voltage in accordance with the control voltage supplied from the external terminal and variation of speed of a plurality of NTL circuits can be suppressed and the testability efficiency of the large capacity gate array integrated circuit formed by the NTL circuit can be improved. The falling rate of output signal can always be improved effectively irrespective of external environment of the load means of the NTL circuit by forming the bias circuit with the resistance which feeds back the output signal. The circuit configuration described above can also be used in the gate circuit or latch circuit by ECL circuit in addition to the NTL circuit, resulting in wide range operation principle of the present invention.

(5) From the items (1) to (4), high integration density can be realized because the lower power consumption can be realized without impeding high speed operation of the high speed logic integrated circuit including the NTL circuit.

While the present invention has been explained based on the embodiment thereof, the present invention is naturally not limited and allows various changes or modifications without departure from the scope of the invention.

For example, in each embodiment, the high level $V_H$ and low level $V_L$ of the digital input signals $V_{i1}$-$V_{i6}$ and digital output signals $v_{o1}$-$V_{o9}$ can be set to the desired levels. In addition, the power source voltage $V_{cc}$ of circuit may be replaced with a positive source source voltage by setting the power source voltage $V_{ee}$ of circuit to the ground potential and the polarity thereof can also be inverted by replacing the bipolar transistor with the PNP transistor. The phase split circuit 1, phase inversion circuit 14, D latch circuit 21, current switching circuit 22 and complementary signal circuit 23 shown in the embodiments of FIG. 5, FIG. 8, FIG. 10-FIG. 14, FIG. 16-FIG. 19 and FIG. 22-FIG. 26 may be formed using the NOS (metal-oxide-semiconductor) transistor, and a speed-up capacitance may be provided to the resistance $R_3$ to be provided between the emitter of bipolar transistor $Q_1$ forming the phase split circuit 1 and the power source voltage $V_{ee}$ in the embodiment shown in FIG. 5, FIG. 8, FIG. 10-FIG. 14, FIG. 16-FIG. 19 and FIG. 22. Moreover, the embodiments shown in FIG. 10, FIG. 14 and FIG. 22 are capable of providing a desired number of fan-in by replacing the bipolar transistor $Q_1$ forming the phase split circuit 1 with a plurality of transistors connected in parallel. In FIG. 18, the base of pull-down transistor $Q_{23}$ forming the active pull-down circuit may be coupled directly to the nodes connected in common of the resistances $R_{10}$ and $R_{11}$ without passing through the resistance $R_{12}$. In FIG. 19, the diode $D_1$ provided between the bipolar transistor $Q_4$ forming the bias circuit 3 and the power source voltage $V_{cc}$ of the circuit may be replaced with a plurality of diodes or transistors in accordance with the level of constant voltage $V_{b3}$ and the capacitance $C_{a2}$ may be removed. In addition, combination of a practical circuit configuration and power source voltage in each embodiment can employ various forms.

In above explanation, the inventions by the inventors of the present invention are applied to the NTL circuit and ECL circuit of the gate array which is the application field as the background of the present invention, but the application field is not limited thereto and the present invention can also be applied, for example, to the semiconductor integrated circuit device such as MPU (microprocessor) of which application field is fixed. The present invention can be applied at least to the logic circuit including the output emitter follower circuit or various kinds of semiconductor integrated circuit device including such logic circuit.

What is claimed is:

1. A semiconductor integrated circuit comprising:
   an inputting means for forming complementary first and second signals in accordance with an input signal supplied to an input terminal;
   a first voltage level outputting means for supplying an output signal of a first voltage level to an output terminal in accordance with the voltage level of said first signal; and
   a second voltage level outputting means for supplying temporarily an output signal of a second voltage level to said output terminal in accordance with said second signal formed by said inputting means depending on change of the voltage level of said input signal,
   wherein said inputting means comprises a first bipolar transistor in which a base is coupled to the input terminal,
   wherein said first voltage level outputting means comprises a second bipolar transistor forming an emitter follower in which a base is coupled to the collector of said first bipolar transistor, and an emitter to the output terminal, and
   wherein said second voltage level outputting means comprises a third bipolar transistor and a first capacitance, said third bipolar transistor having a collector coupled to the output terminal, having a base connected to a first electrode of said first capacitance, a second electrode of the first capacitance being coupled to the emitter of the first bipolar transistor.

2. A semiconductor integrated circuit according to claim 1, comprising a bias means for supplying a third signal of a third voltage level to the base of said third bipolar transistor.

3. A semiconductor integrated circuit according to claim 3, wherein said bias means comprises a fourth bipolar transistor having an emitter coupled to the base of said third bipolar transistor and a base for receiving a fourth signal.

4. A semiconductor integrated circuit according to claim 3, wherein the collectors of said second and fourth bipolar transistors are formed in common on a semiconductor chip.

5. A semiconductor integrated circuit according to claim 2, wherein said bias means comprises a resistance means coupled between the output terminal and the base of the third bipolar transistor.

6. A semiconductor integrated circuit according to claim 3, comprising a clamp means connected to the output terminal for keeping the voltage level of the output terminal to the level higher than a predetermined voltage level.

7. A semiconductor integrated circuit according to claim 6, wherein said clamp means comprises a fifth bipolar transistor in which an emitter is coupled to the output terminal and a fifth signal is supplied to a base.

8. A semiconductor integrated circuit according to claim 7, wherein the collectors of said second, fourth and fifth bipolar transistors are formed in common on a semiconductor chip.

9. A semiconductor integrated circuit according to claim 1, further comprising a promoting means including the second capacitor, of which first electrode is coupled to a first electrode of first capacitor and second electrode to the output terminal, in order to promote the output operation of the second voltage level outputting means.

10. A semiconductor integrated circuit according to claim 9, comprising a bias means for supplying a third signal of a third voltage level to the base of said third bipolar transistor.

11. A semiconductor integrated circuit according to claim 10, wherein said bias means comprises a fourth bipolar transistor in which an emitter is coupled to the base of said third bipolar transistor and a fourth signal is supplied to a base.

12. A semiconductor integrated circuit according to claim 11, comprising a clamp means coupled to the output terminal for keeping a voltage level of the output terminal to a level higher than a predetermined voltage level.

13. A semiconductor integrated circuit according to claim 12, wherein the clamp circuit includes the fifth bipolar transistor in which the emitter is coupled to the output terminal and the fifth signal is supplied to the base.

14. A semiconductor integrated circuit comprising:
a logic means for supplying complementary first and second output signals to output terminals of first and second output terminals in response to an input signal;
a first removing means which is coupled to said first output terminal to remove a voltage level of the first output terminal,
a second removing means which is coupled to said second output terminal to remove a voltage level of the second output terminal,
a first driving means which is coupled between said second output terminal and said first removing means and for creating a first signal to carry out removing operation of said first removing means when the second output signal supplied to the second output terminal changes to a second voltage level from a first voltage level,
a second driving means which is coupled between the first output terminal and the second removing means and for creating a second signal to carry out removing operation of said second removing means when the first output signal supplied to the first output terminal changes to a second voltage le%el from a first voltage level,
a first feedback means which is coupled between the first output terminal and the first removing means and for feeding back the first output signal supplied to the first output terminal to said first removing means, and
a second feedback means which is coupled between the second output terminal and the first removing means and for feeding back the second output signal supplied to the second output terminal to said second removing means.

15. A semiconductor integrated circuit according to claim 14, wherein said logic means is an ECL logic circuit, said first removing means comprises a first bipolar transistor in which a collector is coupled to the first output terminal and a base to said first feedback means and said first driving means, said second removing means comprises a second bipolar transistor in which a collector is coupled to the second output terminal and a base to said second feedback means and said second driving means, said first driving circuit comprises a first capacitance in which a first electrode is coupled to the base of said first bipolar transistor and a second electrode to the second output terminal, and said second driving circuit comprises a second capacitance in which a first electrode is coupled to the base of said second bipolar transistor and a second electrode to the first output terminal.

16. A logic circuit according to claim 15, wherein said first feedback means comprises a first resistance means coupled between the first output terminal and the base of the first bipolar transistor and said second feedback means comprises a second resistance means coupled between the second output terminal and the base of the second bipolar transistor.

17. A logic circuit according to claim 15, wherein said first feedback means comprises a third bipolar transistor in which a base is coupled to the first output terminal and an emitter to the base of the first bipolar transistor, and said second feedback means comprises a fourth bipolar transistor in which a base is coupled to the second output terminal and an emitter to the base of the second bipolar transistor.

18. A plurality of unit circuits formed on a semiconductor chip having a plurality of electrodes, at least one unit circuit of said unit circuits comprising an input means for forming complementary first and second signals in accordance with an input signal supplied to an input terminal, a first voltage level outputting means for supplying an output signal of a first voltage level to an output terminal depending on a first voltage level signal, and a second voltage level outputting means for temporarily supplying an output signal of a second voltage level to the output terminal depending on the second signal created by the input means in accordance with change of voltage level of the power source voltage input signal, wherein at least one electrode among the plurality of electrodes is coupled to the power source voltage terminal of said unit circuit.

19. A semiconductor integrated circuit according to claim 18, at least one unit circuit among the plurality of unit circuits is formed as a first capacitance.

20. A semiconductor integrated circuit according to claim 19, second capacitances are formed between the plurality of unit circuits.

21. A semiconductor integrated circuit according to claim 20, said semiconductor chip comprises a plurality of electrodes and is attached to the chip mounting carrier having a third capacitance formed therein.

22. A semiconductor integrated circuit comprising:
a first bipolar transistor having a collector and an emitter at which complementary first and second signals are formed in accordance with an input signal supplied to a base;
a second bipolar transistor having a base coupled to said collector of said first bipolar transistor and an emitter coupled to an output terminal;

a third bipolar transistor having a base coupled to said emitter of said first bipolar transistor and a collector coupled to said output terminal;

a first capacitor having a first electrode coupled to said emitter of said first bipolar transistor and a second electrode to said base of said third bipolar transistor; and first clamp means for keeping a voltage level of said base of said third bipolar transistor to a level higher than a predetermined voltage level.

23. A semiconductor integrated circuit according to claim 22, wherein said first clamp means comprises a fourth bipolar transistor having an emitter coupled to a common coupling node of said second electrode of said first capacitor and the base of said third bipolar transistor, having a collector coupled to a collector of said second bipolar transistor and having a base coupled to receive a third signal.

24. A semiconductor integrated circuit according to claim 23, wherein said first clamp means comprises a first resistor coupled between said common coupling node and an emitter of said third bipolar transistor.

25. A semiconductor integrated circuit according to claim 24, wherein said collector of said second bipolar transistor is coupled to a first power supply voltage terminal.

26. A semiconductor integrated circuit according to claim 25, wherein said emitter of said third bipolar transistor is coupled to a second power supply voltage terminal.

27. A semiconductor integrated circuit according to claim 26, further comprising a second resistor coupled between said collector of said first bipolar transistor and said first power supply voltage terminal.

28. A semiconductor integrated circuit according to claim 27, further comprising a third resistor coupled between said emitter of said first bipolar transistor and said second power supply voltage terminal.

29. A semiconductor integrated circuit according to claim 28, further comprising a second capacitor having a first electrode coupled to said output terminal and a second electrode coupled to said common coupling node.

30. A semiconductor integrated circuit according to claim 29, further comprising a second clamp means coupled to said output terminal for keeping a voltage level of said output terminal to a level higher than a predetermined voltage level.

31. A semiconductor integrated circuit according to claim 26, further comprising a second resistor coupled between said collector of said first bipolar transistor and a third power supply voltage terminal.

32. A semiconductor integrated circuit according to claim 31, further comprising a third resistor coupled between said emitter of said first bipolar transistor and a fourth power supply voltage terminal.

33. A semiconductor integrated circuit according to claim 24, wherein said first capacitor comprises an isolation film formed between said first electrode and said second electrode.

34. A semiconductor integrated circuit according to claim 29, wherein said second capacitor comprises an isolation film formed between said first electrode and said second electrode.

35. A semiconductor integrated circuit according to claim 28, further comprising a second capacitor having a first electrode coupled to said output terminal and a second electrode coupled to said base of said fourth bipolar transistor.

36. A semiconductor integrated circuit according to claim 35, further comprising a bias means coupled between said first power supply voltage terminal and said second power supply voltage terminal for forming said third signal.

37. A semiconductor integrated circuit according to claim 36, wherein said bias means comprises a diode and a fourth resistor connected in series.

* * * * *

REEXAMINATION CERTIFICATE (2002nd)
United States Patent [19]

Usami et al.

[11] B1 4,999,520

[45] Certificate Issued    May 11, 1993

[54] HIGH SPEED TTL BUFFER CIRCUIT WHICH IS RESISTIVE TO THE INFLUENCE OF ALPHA-RAYS

[75] Inventors: Mitsuo Usami, Tokyo; Noboru Shiozawa, Ohme; Toshio Yamada; Hiromasa Katoh, both of Hamura; Kazuyoshi Satoh, Tokorozawa; Tohru Kobayashi, Iruma; Tatsuya Kimura, Ohme; Masato Hamamoto, Ohme; Atsushi Shimizu, Ohme; Kaoru Koyu, Ohme, all of Japan

[73] Assignee: Hitachi, Ltd., Tokyo, Japan

Reexamination Request:
No. 90/002,569, Feb. 12, 1992

Reexamination Certificate for:
Patent No.: 4,999,520
Issued: Mar. 12, 1991
Appl. No.: 330,461
Filed: Mar. 30, 1989

[30] Foreign Application Priority Data

Apr. 2, 1988 [JP] Japan ................ 63-81645
Apr. 12, 1988 [JP] Japan ................ 63-89622
Oct. 28, 1988 [JP] Japan ................ 63-274170

[51] Int. Cl.[5] .......... H03K 3/33; H03K 17/04; H03K 19/088; H03K 19/013

[52] U.S. Cl. .................. 307/456; 307/443; 307/300; 307/280

[58] Field of Search ........... 307/443, 454, 455, 456, 307/272.1, 291, 280, 300, 308, 254, 263, 270

[56] References Cited

U.S. PATENT DOCUMENTS

| | | | |
|---|---|---|---|
| 3,514,720 | 5/1970 | Roucache et al. | 307/262 |
| 3,581,124 | 5/1971 | Flores et al. | 307/270 |
| 4,490,630 | 12/1984 | Freeman | 307/455 |
| 4,605,870 | 8/1986 | Dansky et al. | 307/443 |
| 4,614,885 | 9/1986 | Brosch et al. | 307/513 |
| 4,680,480 | 7/1987 | Hopta | 307/270 |
| 4,798,972 | 1/1989 | Melanson et al. | 307/270 |

OTHER PUBLICATIONS

Holt, "Electronic Circuits: Digital and Analog", John Wiley & Sons, New York, 1978, pp. 176-177.

*Primary Examiner*—Timothy P. Callahan

[57] ABSTRACT

A semiconductor integrated circuit wherein an input circuit is formed by a phase split circuit consisting of a bipolar transistor which outputs an inverted output from the collector and non-inverted output from the emitter, the emitter follower output circuit is driven by an inverted output of the phase split circuit, meanwhile, an emitter load of the emitter follower output circuit is formed by a transmitter, and the emitter load transistor is temporarily driven conductively by a charging current of the capacitance to be charged by the rising edge of the non-inverted output of the phase split circuit.

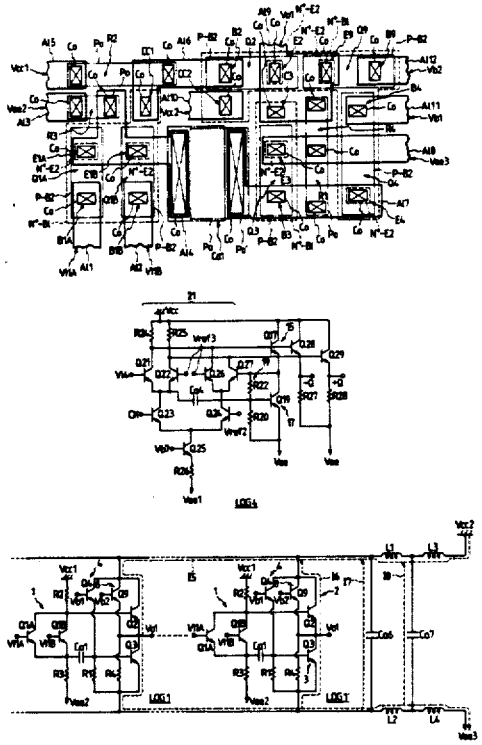

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 61–68:

However, when the input $V_n$ is changed to the high level H from the low level L and thereby the output $V_{O10}$ is changed to the low level L from the high level H, it is requested to wait for the charge of load capacitance $CL_3$ to be passively discharged by the emitter load resistance $R_{36}$. Therefore, comparatively longer delay time $t_{pd2}$ is generated at the change of output [$V_{o9}$] $V_{O10}$ to the low level L from the high level H.

Column 7, lines 25–64:

Under the steady condition, when the α-ray α is incident to the bipolar transistor $Q_1$, the [halls] *holes* ⊕ and electrons ⊖ are generated in the depletion layer region $D_r$. The electrons ⊖ are collected to the collector region of bipolar transistor $Q_1$ having the higher potential, thereby providing the effect as it were applying a leak current to the P type semiconductor substrate from the collector region of the bipolar transistor $Q_1$. In this case, a virtual collector current generated by the α-ray lowers the collector current of bipolar transistor $Q_1$ but almost does not give any effect on the emitter voltage of bipolar transistor $Q_1$ since the base voltage is constant. Accordingly, the pull-down transistor $Q_3$ maintains the non-conductive condition without receiving the effect of α-ray. While the pull-down transistor $Q_3$ sustains the non-conductive condition, the charges of load capacitance $CL_1$ is not discharged quickly even if only the collector voltage of bipolar transistor $Q_1$ is lowered temporarily by the α-ray. Moreover, when the α-ray is incident to the pull-down transistor $Q_3$, the collector voltage of pull-down transistor $Q_3$ is caused to become low as in the case of explanation about operation of pull-down transistor $Q_3$ for the α-ray, but the collector of pull-down transistor $Q_3$ is clamped by operations of emitter follower transistor $Q_2$ and it does not drop largely. Therefore, the pull-down transistor $Q_3$ maintains the non-conductive condition and the charges of load capacitance $CL_1$ is not discharged quickly. In addition, it is impossible for the α-ray entering the emitter follower transistor $Q_1$ (or pull-down transistor $Q_3$) to be incident to the pull-down transistor $Q_3$ (or bipolar transistor $Q_1$) from the characteristic of the α-ray and it is almost far from possibility that a couple of α-rays are respectively incident to the bipolar transistor $Q_1$ and pull-down transistor $Q_3$. Accordingly, the digital output signal $V_{o1}$ does not become low so much as drop of the collector voltage of bipolar transistor $Q_1$, for example, even when the α-ray is incident to the bipolar transistor $Q_1$ or pull-down transistor $Q_3$. Namely, the influence of α-ray can be eased.

AS A RESULT OF REEXAMINATION, IT HAS BEEN DETERMINED THAT:

Claims 2, 3, 10, 11, 23-28 and 31-33 are cancelled.

Claims 1, 4-7, 9, 12-22, 29 and 34-36 are determined to be patentable as amended.

Claims 8, 30 and 37, dependent on an amended claim, are determined to be patentable.

New claims 38-52 are added and determined to be patentable.

1. A semiconductor integrated circuit comprising:
*an input terminal for receiving an input signal;*
*an output terminal for supplying an output signal;*
*first and second terminals for receiving first and second supply voltages, respectively;* an inputting means for forming complementary first and second signals in accordance with [an] *the* input signal supplied to [an] *said* input terminal;
a first voltage level outputting means for supplying [an] *the* output signal of a first voltage level to [an] *said* output terminal in accordance with the voltage level of said first signal; and
second voltage level outputting means for supplying temporarily [an] *the* output signal of a second voltage level to said output terminal in accordance with said second signal formed by said inputting means depending on change of the voltage level of said input signal,
wherein said inputting means comprises:
a first bipolar transistor [in which] *having* a base [is] coupled to the input terminal, *an emitter and a collector,*
*a collector load coupled between said first terminal and the collector of said first bipolar transistor, and*
*an emitter load coupled between the emitter of said first bipolar transistor and said second terminal,*
wherein said first voltage level outputting means comprises a second bipolar transistor forming an emitter follower [in] which *has* a base [is] coupled to the collector of said first bipolar transistor, *a collector coupled to said first terminal* and an emitter *coupled* to the output terminal, [and]
wherein said second voltage level outputting means comprises a third bipolar transistor and a first [capacitance] *capacitor having first and second electrodes*, said third bipolar transistor having a collector coupled to the output terminal, [having] a base [connected] *coupled* to [a] *the first electrode of* said first [capacitance] *capacitor and an emitter coupled to said second terminal,* [a] *the second electrode of the first* [capacitance] *capacitor* being coupled to the emitter of the first bipolar transistor,
*wherein said first capacitor includes a dielectric film formed between the first electrode and the second electrode,*
*wherein said semiconductor integrated circuit further comprises bias means for supplying a third signal of a third voltage level to the base of said third bipolar transistor, and*
*wherein said bias means comprises a fourth bipolar transistor having an emitter coupled to the base of said* third bipolar transistor, a base for receiving a fourth signal and a collector coupled to said first terminal, and a resistor coupled between the base and emitter of said third bipolar transistor.

4. A semiconductor integrated circuit according to claim [3] *1*, wherein the collectors of said second and fourth bipolar transistors are formed in common on a semiconductor chip.

5. A semiconductor integrated circuit [according to claim 2,] *comprising:* an input terminal for receiving an input signal;

an output terminal for supplying an output signal;

first and second terminals for receiving first and second supply voltages, respectively;

*an inputting means for forming complementary first and second signals in accordance with the input signal supplied to said input terminal;*

*a first voltage level outputting means for supplying the output signal of a first voltage level to said output terminal in accordance with the voltage level of said first signal; and*

*a second voltage level outputting means for supplying temporarily the output signal of a second voltage level to said output terminal in accordance with said second signal formed by said inputting means depending on change of the voltage level of said input signal,*

*wherein said inputting means comprises:*

*a first bipolar transistor having a base coupled to the input terminal, an emitter and a collector,*

*a collector load coupled between said first terminal and the collector of said first bipolar transistor, and*

*an emitter load coupled between the emitter of said first bipolar transistor and said second terminal,*

*wherein said first voltage level outputting means comprises a second bipolar transistor forming an emitter follower which has a base coupled to the collector of said first bipolar transistor, a collector coupled to said first terminal and an emitter coupled to the output terminal,*

*wherein said second voltage level outputting means comprises a third bipolar transistor and a first capacitor having first and second electrodes, said third bipolar transistor having a collector coupled to the output terminal, a base coupled to the first electrode of said first capacitor and an emitter coupled to said second terminal, the second electrode of said first capacitor being coupled to the emitter of said first bipolar transistor,*

*wherein said first capacitor includes a dielectric film formed between the first electrode and the second electrode,*

*wherein said semiconductor integrated circuit further comprises bias means for supplying a third signal of a third voltage level to the base of said third bipolar transistor,* wherein said bias means comprises a resistance means coupled between the output terminal and the base of the third bipolar transistor.

6. A semiconductor integrated circuit according to claim [3] *1*, comprising a clamp means connected to the output terminal for keeping the voltage level of the output terminal [to the] *at a* level higher than a predetermined voltage level.

7. A semiconductor integrated circuit according to claim 6, wherein said clamp means comprises a fifth bipolar transistor [in which] *having* an emitter [is] coupled to the output terminal [and], *a base coupled to receive* a fifth signal [is supplied to a base] *and a collector coupled to said first terminal.*

9. A semiconductor integrated circuit according to claim 1, further comprising a promoting means *for promoting the output operation of said second voltage level outputting means and* including [the] *a* second capacitor, of which *a* first electrode is coupled to [a] *the* first electrode of *said* first capacitor and *a* second electrode *is coupled* to the *said* output terminal[, in order to promote the output operation of the second voltage level outputting means].

12. A semiconductor integrated circuit according to claim [11] *9*, comprising a clamp means coupled to the output terminal for keeping a voltage level of the output terminal to a level higher than a predetermined voltage level.

13. A semiconductor integrated circuit according to claim 12, wherein the clamp [circuit] *means* includes [the] *a* fifth bipolar transistor [in which the] *having* an emitter [is] coupled to [the] *said* output terminal [and the], *a base coupled to receive a* fifth signal [is supplied to the base] *and a collector coupled to said first terminal.*

14. A semiconductor integrated circuit comprising:

a logic means for supplying complementary first and second output signals to [output terminals of] first and second output terminals in response to an input signal;

a first removing means which is coupled to said first output terminal to remove a voltage level of the first output terminal, a second removing means which is coupled to said second output terminal to remove a voltage level of the second output terminal, a first driving means which is coupled betweeen said second output terminal and said first removing means and for creating a first signal to carry out removing operation of said first removing means when the second output signal supplied to the second output terminal changes to a second voltage level from a first voltage level, a second driving means which is coupled between the first output terminal and the second removing means and for creating a second signal to carry out removing operation of said second removing means when the first output signal supplied to the first output terminal changes to a second voltage [le%el] *level* from a first voltage level, a first feedback means which is coupled between the first output terminal and the first removing means and for feeding back the first output signal supplied to the first output terminal to said first removing means, and a second feedback means which is coupled between the second output terminal and the first removing means and for feeding back the second output signal supplied to the second output terminal to said second removing means.

15. A semiconductor integrated circuit according to claim 14, wherein said logic means is an ECL [logic] circuit, said first removing means comprises a first bipolar transistor [in which] *having* a collector [is] coupled to the first output terminal and a base *coupled* to said first feedback means and *to* said first driving means, said second removing means comprises a second bipolar transistor [in which] *having* a collector [is] coupled to the second output terminal and a base *coupled* to said second feedback means and *to* said second driving means, said first driving [circuit] *means* comprises a first capacitance [in which] *having* a first electrode [is] coupled to the base of said first bipolar transistor and a second electrode *coupled* to the second output terminal, and said second driving [circuit] *means* comprises a second capacitance [in which] *having* a first electrode [is] coupled to the base of said second bipolar transistor and a second electrode *coupled* to the first output terminal.

16. A [logic] *semiconductor integrated* circuit according to claim 15, wherein said first feedback means comprises a first resistance means coupled between the first output terminal and the base of the first bipolar transistor and said second feedback means comprises a second resistance means coupled between the second output terminal and the base of the second bipolar transistor.

17. A [logic] *semiconductor integrated* circuit according to claim 15, wherein said first feedback means comprises a third bipolar transistor in which a base is coupled to the first output terminal and an emitter *is coupled* to the base of the first bipolar transistor, and *wherein* said second feedback means comprises a fourth bipolar transistor in which a base is coupled to the second output terminal and an emitter *is coupled* to the base of the second bipolar transistor.

18. A [plurality of unit circuits] *semiconductor integrated circuit device* formed on a semiconductor chip [having] *comprising:*
   a plurality of electrodes *including first and second electrodes for receiving first and second supply voltages, respectively;*
   *first and second wirings coupled to said first and second electrodes, respectively;*
   *a plurality of cells arranged in rows, said plurality of cells comprising first cells in which logic circuits are formed, each of said logic circuits including:*
   [at least one unit circuit of said unit circuits comprising] an input means for forming complementary first and second signals in accordance with an input signal supplied to an input terminal, *said input means including:*
   *first and second load elements, and*
   *a first bipolar transistor having a base coupled to receive the input signal, a collector coupled to said first load element and an emitter coupled to said second load element,*
   *wherein the first signal is provided from a connection point of the collector of said first bipolar transistor and said first load element, and*
   *wherein the second signal is provided from a connection point of the emitter of said first bipolar transistor and said second load element,*
   a first voltage level outputting means for supplying an output signal of a first voltage level to an output terminal depending on [a first] *the* voltage level *of said first* signal, *said first voltage level outputting means including a second bipolar transistor having a base coupled to receive the first signal, a collector coupled to said first wiring and an emitter coupled to the output terminal,* [and]
   a second voltage level outputting means for temporarily supplying an output signal of a second voltage level to the output terminal depending on the second signal created by the input means in accordance with change of voltage level of the [power source voltage] input signal, *said second voltage level outputting means including:*
   a third bipolar transistor having *a collector coupled to the output terminal,* an emitter coupled to said second wiring and a base, and
   *a first capacitor coupled between the emitter of the first bipolar transistor and the base of the third bipolar transistor and having a dielectric film therein, and*
   bias means coupled to the base of said third bipolar transistor *and for biasing the base of said third bipolar transistor to a predetermined voltage,* [wherein at least one electrode among the plurality of electrodes is coupled to the power source voltage terminal of said unit circuit], *wherein said bias comprises a fourth bipolar transistor having an emitter coupled to the base of said third bipolar transistor, a collector coupled to said collector of said second bipolar transistor and a base coupled to receive a signal of a predetermined voltage level, and wherein said bias means further comprises a resistor coupled between said base and emitter of said third bipolar transistor.*

19. A semiconductor integrated circuit *device* according to claim 18, [at least one unit circuit among] *wherein* the plurality of [unit circuits is formed as] *cells further include at least one second cell which is used for* a first capacitance *coupled between said first and second wirings.*

20. A semiconductor integrated circuit *device* according to claim 19, *further comprising* second capacitances [are] *coupled between said first and second wirings and* formed between the *rows of the* plurality of [unit circuits] *cells.*

21. A semiconductor integrated circuit *device* according to claim 20, *wherein* said semiconductor chip [comprises a plurality of electrodes and] is attached [to the] *on a* chip mounting carrier having [a third capacitance formed therein] *a plurality of electrodes which are electrically coupled to said plurality of electrodes of said semiconductor integrated circuit device, wherein said chip mounting carrier includes a third capacitance electrically coupled between the first and second electrodes of the semiconductor chip.*

22. A semiconductor integrated circuit comprising:
   an input terminal for receiving an input signal;
   an output terminal;
   first and second terminals for receiving first and second supply voltages, respectively;
   a first bipolar transistor having *a base coupled to said input terminal,* a collector and an emitter [at which complementary first and second signals are formed in accordance with an input signal supplied to a base];
   *a first load element coupled between said first terminal and said collector of said first bipolar transistor;*
   *a second load element coupled between said second terminal and said emitter of said first bipolar transistor;*
   a second bipolar transistor having a base coupled to said collector of said first bipolar transistor, *a collector coupled to said first terminal* and an emitter coupled to [an] *said* output terminal;
   a third bipolar transistor having a base [coupled to said emitter of said first bipolar transistor and], a collector coupled to said output terminal *and an emitter coupled to said second terminal;*
   a first capacitor having a first electrode coupled to said emitter of said first bipolar transistor [and], a second electrode *coupled* to said base of said third bipolar transistor, *and a dielectric film disposed between the first and second electrodes;* and first clamp means for keeping a voltage level of said base of said third bipolar transistor to a level higher than a predetermined voltage level, wherein said first clamp means comprises a fourth bipolar transistor having an emitter coupled to said base of said third bipolar transistor, having a collector coupled to said collector of said second bipolar transistor and having a base coupled to receive a third signal, and wherein said first clamp means further comprises a first resistor coupled between said base and emitter of said third bipolar transistor.

29. A semiconductor integrated circuit according to claim [28] 22, further comprising a second capacitor having a first electrode coupled to said output terminal and a second electrode coupled to said [common coupling node] base of said third bipolar transistor.

34. A semiconductor integrated circuit according to claim 29, wherein said second capacitor comprises [an isolation] a dielectric film formed between said first electrode and said second electrode.

35. A semiconductor integrated circuit according to claim [28] 24, further comprising a second capacitor having a first electrode coupled to said output terminal and a second electrode coupled to said base of said fourth bipolar transistor.

36. A semiconductor integrated circuit according to claim 35, further comprising a bias means coupled between said first [power supply voltage] terminal and said second [power supply voltage] terminal for forming said third signal.

38. A semiconductor integrated circuit comprising:
an input terminal for receiving an input signal;
an output terminal;
first and second terminals for receiving first and second supply voltages, respectively;
third and fourth terminals for receiving third and fourth supply voltages, respectively, said third supply voltage being identical to said first supply voltage, said fourth supply voltage being identical to said second supply voltage;
a first bipolar transistor having a base coupled to said input terminal, a collector and an emitter;
a first load element coupled between said third terminal and said collector of said first bipolar transistor;
a second load element coupled between said fourth terminal and said emitter of said first bipolar transistor;
a second bipolar transistor having a base coupled to said collector of said first bipolar transistor, a collector coupled to said first terminal and an emitter coupled to said output terminal;
a third bipolar transistor having a base, a collector coupled to said output terminal and an emitter coupled to said second terminal;
a first capacitor having a first electrode coupled to said emitter of said first bipolar transistor, a second electrode coupled to said base of said third bipolar transistor, and a dielectric film disposed between the first and second electrodes; and
a first clamp means for keeping a voltage level of said base of said third bipolar transistor to a level higher than a predetermined voltage level, wherein said clamp means includes:
a fourth bipolar transistor having an emitter coupled to said base of said third bipolar transistor, a collector coupled to said collector of said second bipolar transistor and a base coupled to receive a predetermined voltage signal, and a resistor coupled between said base and emitter of said third bipolar transistor.

39. A semiconductor integrated circuit comprising:
an inputting means for forming complementary first and second signals in accordance with an input signal supplied to an input terminal;
a first voltage level outputting means for supplying an output signal of a first voltage level to an output terminal in accordance with the voltage level of said first signal; and
second voltage level outputting means for supplying temporarily an output signal of a second voltage level to said output terminal in accordance with said second signal formed by said inputting means depending on change of the voltage level of said input signal,
wherein said inputting means comprises a first bipolar transistor in which a base is coupled to the input terminal,
wherein said first voltage level outputting means comprises a second bipolar transistor forming an emitter follower in which a base is coupled to the collector of said first bipolar transistor, and an emitter to the output terminal,
wherein said second voltage level outputting means comprises a third bipolar transistor and a first capacitor, said third bipolar transistor having a collector coupled to the output terminal, having a base connected to a first electrode of said first capacitor, a second electrode of the first capacitor being coupled to the emitter of the first bipolar transistor, and
wherein said first capacitor includes a dielectric film formed between the first electrode and the second electrode;
comprising a bias means for supplying a third signal of a third voltage level to the base of said third bipolar transistor;
wherein said bias means comprises a fourth bipolar transistor having an emitter coupled to the base of said third bipolar transistor and a base for receiving a fourth signal and
wherein the collectors of said second and fourth bipolar transistors are formed in common on a semiconductor chip.

40. A semiconductor integrated circuit comprising:
an inputting means for forming complementary first and second signals in accordance with an input signal supplied to an input terminal;
a first voltage level outputting means for supplying an output signal of a first voltage level to an output terminal in accordance with the voltage level of said first signal; and
second voltage level outputting means for supplying temporarily an output signal of a second voltage level to said output terminal in accordance with said second signal formed by said inputting means depending on change of the voltage level of said input signal,
wherein said inputting means comprises a first bipolar transistor in which a base is coupled to the input terminal,
wherein said first voltage level outputting means comprises a second bipolar transistor forming an emitter follower in which a base is coupled to the collector of said first bipolar transistor, and an emitter to the output terminal,
wherein said second voltage level outputting means comprises a third bipolar transistor and a first capacitor, said third bipolar transistor having a collector coupled to the output terminal, having a base connected to a first electrode of said first capacitor, a second electrode of the first capacitor being coupled to the emitter of the first bipolar transistor, and wherein said first capacitor includes a dielectric film formed between the first electrode and the second electrode;

comprising a bias means for supplying a third signal of a third voltage level to the base of said third bipolar transistor;

wherein said bias means comprises a resistance means coupled between the output terminal and the base of the third bipolar transistor.

41. A semiconductor integrated circuit comprising:

an inputting means for forming complementary first and second signals in accordance with an input signal supplied to an input terminal;

a first voltage level outputting means for supplying an output signal of a first voltage level to an output terminal in accordance with the voltage level of said first signal; and second voltage level outputting means for supplying temporarily an output signal of a second voltage level to said output terminal in accordance with said second signal formed by said inputting means depending on change of the voltage level of said input signal, wherein said inputting means comprises a first bipolar transistor in which a base is coupled to the input terminal, wherein said first voltage level outputting means comprises a second bipolar transistor forming an emitter follower in which a base is coupled to the collector of said first bipolar transistor, and an emitter to the output terminal, wherein said second voltage level outputting means comprises a third bipolar transistor and a first capacitor, said third bipolar transistor having a collector coupled to the output terminal, having a base connected to a first electrode of said first capacitor, a second electrode of the first capacitor being coupled to the emitter of the first bipolar transistor, and wherein said first capacitor includes a dielectric film formed between the first electrode and the second electrode;

comprising a bias means for supplying a third signal of a third voltage level to the base of said third bipolar transistor;

wherein said bias means comprises a fourth bipolar transistor having an emitter coupled to the base of said third bipolar transistor and a base for receiving a fourth signal;

comprising a clamp means connected to the output terminal for keeping the voltage level of the output terminal at a level higher than a predetermined voltage level.

42. A semiconductor integrated circuit according to claim 41, wherein said clamp means comprises a fifth bipolar transistor in which an emitter is coupled to the output terminal and a fifth signal is supplied to a base.

43. A semiconductor integrated circuit according to claim 41, wherein the collectors of said second, fourth and fifth bipolar transistors are formed in common on a semiconductor chip.

44. A semiconductor integrated circuit comprising:

an inputting means for forming complementary first and second signals in accordance with an input signal supplied to an input terminal;

a first voltage level outputting means for supplying an output signal of a first voltage level to an output terminal in accordance with the voltage level of said first signal; and second voltage level outputting means for supplying temporarily an output signal of a second voltage level to said output terminal in accordance with said second signal formed by said inputting means depending on change of the voltage level of said input signal, wherein said inputting means comprises a first bipolar transistor in which a base is coupled to the input terminal, wherein said first voltage level outputting means comprises a second bipolar transistor forming an emitter follower in which a base is coupled to the collector of said first bipolar transistor, and an emitter to the output terminal, wherein said second voltage level outputting means comprises a third bipolar transistor and a first capacitor, said third bipolar transistor having a collector coupled to the output terminal, having a base connected to a first electrode of said first capacitor, a second electrode of the first capacitor being coupled to the emitter of the first bipolar transistor, and wherein said first capacitor includes a dielectric film formed between the first electrode and the second electrode;

further comprising a promoting means including a second capacitor, of which a first electrode is coupled to a first electrode of the first capacitor and a second electrode is coupled to the output terminal, in order to promote the output operation of the second voltage level outputting means.

45. A semiconductor integrated circuit according to claim 44, comprising a bias means for supplying a third signal of a third voltage level to the base of said third bipolar transistor.

46. A semiconductor integrated circuit according to claim 45, wherein said bias means comprises a fourth bipolar transistor in which an emitter is coupled to the base of said third bipolar transistor and a fourth signal is supplied to a base.

47. A semiconductor integrated circuit according to claim 46, comprising a clamp means coupled to the output terminal for keeping a voltage level of the output terminal to a level higher than a predetermined voltage level.

48. A semiconductor integrated circuit according to claim 47, wherein the clamp circuit includes the fifth bipolar transistor in which the emitter is coupled to the output terminal and a fifth signal is supplied to the base.

49. A semiconductor integrated circuit according to claim 1, wherein the resistor has a predetermined value of resistance set to operate the bias means to provide the third signal to the base of the third bipolar transistor to set the third bipolar transistor into a very weak ON condition.

50. A semiconductor integrated circuit according to claim 5, wherein the resistance means has a predetermined value of resistance set to operate the bias means to provide the third signal to the base of the third bipolar transistor to set the third bipolar transistor into a very weak ON condition.

51. A semiconductor integrated circuit according to claim 18, wherein the resistor has a predetermined value of resistance set to operate the bias means to provide the predetermined voltage to the base of the third bipolar transistor to set the third bipolar transistor into a very weak ON condition.

52. A semiconductor integrated circuit according to claim 22, wherein the first resistor has a predetermined value of resistance set to operate the first clamp means to provide a predetermined bias voltage to the base of the third bipolar transistor to set the third bipolar transistor into a very weak ON condition.

* * * * *